US010297582B2

(12) United States Patent
Caskey et al.

(10) Patent No.: US 10,297,582 B2
(45) Date of Patent: May 21, 2019

(54) BVA INTERPOSER

(71) Applicant: Invensas Corporation, San Jose, CA (US)

(72) Inventors: Terrence Caskey, Santa Cruz, CA (US); Ilyas Mohammed, Santa Clara, CA (US); Cyprian Emeka Uzoh, San Jose, CA (US); Charles G. Woychik, San Jose, CA (US); Michael Newman, Fort Collins, CO (US); Pezhman Monadgemi, Fremont, CA (US); Reynaldo Co, Santa Cruz, CA (US); Ellis Chau, San Jose, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/952,064

(22) Filed: Nov. 25, 2015

(65) Prior Publication Data

US 2016/0079214 A1 Mar. 17, 2016

Related U.S. Application Data

(63) Continuation of application No. 13/795,756, filed on Mar. 12, 2013, now Pat. No. 9,502,390.

(Continued)

(51) Int. Cl.
*H01L 25/10* (2006.01)
*H05K 1/02* (2006.01)
(Continued)

(52) U.S. Cl.
CPC ......... *H01L 25/105* (2013.01); *H01L 21/486* (2013.01); *H01L 23/3114* (2013.01);
(Continued)

(58) Field of Classification Search
CPC ........ H05K 1/0298; H05K 1/14; H05K 1/144; H05K 1/145; H05K 1/185
See application file for complete search history.

(56) References Cited

U.S. PATENT DOCUMENTS 2,230,663 A    2/1941  Alden
3,289,452 A   12/1966  Koellner
(Continued)

FOREIGN PATENT DOCUMENTS

CN    1352804 A    6/2002
CN    1641832 A    7/2005
(Continued)

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.

(Continued)

*Primary Examiner* — Hoa C Nguyen
*Assistant Examiner* — Christopher L Augustin
(74) *Attorney, Agent, or Firm* — Lerner, David, Littenberg, Krumholz & Mentlik, LLP

(57) ABSTRACT

A method for making an interposer includes forming a plurality of wire bonds bonded to one or more first surfaces of a first element. A dielectric encapsulation is formed contacting an edge surface of the wire bonds which separates adjacent wire bonds from one another. Further processing comprises removing at least portions of the first element, wherein the interposer has first and second opposite sides separated from one another by at least the encapsulation, and the interposer having first contacts and second contacts at the first and second opposite sides, respectively, for electrical connection with first and second components, (Continued)

respectively, the first contacts being electrically connected with the second contacts through the wire bonds.

11 Claims, 10 Drawing Sheets

Related U.S. Application Data

(60) Provisional application No. 61/679,653, filed on Aug. 3, 2012.

(51) Int. Cl.
  *H05K 3/46* (2006.01)
  *H01L 23/498* (2006.01)
  *H01L 21/48* (2006.01)
  *H01L 23/31* (2006.01)
  *H01L 23/00* (2006.01)
  *H01L 25/065* (2006.01)

(52) U.S. Cl.
  CPC .. *H01L 23/49811* (2013.01); *H01L 23/49827* (2013.01); *H01L 23/49838* (2013.01); *H01L 24/05* (2013.01); *H01L 25/0655* (2013.01); *H05K 1/0298* (2013.01); *H05K 3/46* (2013.01); *H01L 23/49833* (2013.01); *H01L 24/45* (2013.01); *H01L 24/48* (2013.01); *H01L 2224/02379* (2013.01); *H01L 2224/04042* (2013.01); *H01L 2224/16225* (2013.01); *H01L 2224/45124* (2013.01); *H01L 2224/45144* (2013.01); *H01L 2224/45147* (2013.01); *H01L 2224/45664* (2013.01); *H01L 2224/48091* (2013.01); *H01L 2224/48108* (2013.01); *H01L 2224/48227* (2013.01); *H01L 2224/73207* (2013.01); *H01L 2224/73257* (2013.01); *H01L 2225/107* (2013.01); *H01L 2225/1023* (2013.01); *H01L 2225/1052* (2013.01); *H01L 2225/1058* (2013.01); *H01L 2924/00014* (2013.01); *H01L 2924/15311* (2013.01); *H01L 2924/181* (2013.01); *H01L 2924/381* (2013.01); *Y10T 29/49126* (2015.01); *Y10T 29/49162* (2015.01)

(56) References Cited

U.S. PATENT DOCUMENTS

| | | |
|---|---|---|
| 3,358,897 A | 12/1967 | Christensen |
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Racy |
| 4,072,816 A | 2/1978 | Gedney et al. |
| 4,213,556 A | 7/1980 | Ersson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | Difrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A * | 11/1995 | Higgins, III .......... H01L 21/563 257/697 |
| 5,476,211 A | 12/1995 | Khandros |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,977,640 A | 11/1999 | Bertin et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |

(56) References Cited

U.S. PATENT DOCUMENTS

| | | |
|---|---|---|
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,476,503 B1 | 11/2002 | Imamura et al. |
| 6,476,506 B1 | 11/2002 | O'Connor et al. |
| 6,476,583 B2 | 11/2002 | McAndrews |
| 6,486,545 B1 | 11/2002 | Glenn et al. |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,563,205 B1 | 5/2003 | Fogal et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth |
| 6,687,988 B1 | 2/2004 | Sugiura et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,741,085 B1 | 5/2004 | Khandros et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,787,926 B2 | 9/2004 | Chen et al. |
| 6,790,757 B1 | 9/2004 | Chittipeddi et al. |
| 6,812,575 B2 | 11/2004 | Furusawa |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,908,785 B2 | 6/2005 | Kim |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mutaguchi |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |

(56) References Cited

U.S. PATENT DOCUMENTS

| | | |
|---|---|---|
| 7,262,124 B2 | 8/2007 | Fujisawa |
| 7,262,506 B2 | 8/2007 | Mess et al. |
| 7,268,421 B1 | 9/2007 | Lin |
| 7,276,785 B2 | 10/2007 | Bauer et al. |
| 7,276,799 B2 | 10/2007 | Lee et al. |
| 7,287,322 B2 | 10/2007 | Mathieu et al. |
| 7,290,448 B2 | 11/2007 | Shirasaka et al. |
| 7,294,920 B2 | 11/2007 | Chen et al. |
| 7,294,928 B2 | 11/2007 | Bang et al. |
| 7,301,770 B2 | 11/2007 | Campbell et al. |
| 7,323,767 B2 | 1/2008 | James et al. |
| 7,327,038 B2 | 2/2008 | Kwon et al. |
| 7,344,917 B2 | 3/2008 | Gautham |
| 7,355,289 B2 | 4/2008 | Hess et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,459,348 B2 | 12/2008 | Saeki |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,179 B2 | 2/2009 | Kubota et al. |
| 7,495,342 B2 | 2/2009 | Beaman et al. |
| 7,517,733 B2 | 4/2009 | Camacho et al. |
| 7,528,474 B2 | 5/2009 | Lee |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,560,360 B2 | 7/2009 | Cheng et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,595,548 B2 | 9/2009 | Shirasaka et al. |
| 7,612,638 B2 | 11/2009 | Chung et al. |
| 7,621,436 B2 | 11/2009 | Mii et al. |
| 7,625,781 B2 | 12/2009 | Beer |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,617 B2 | 2/2010 | Kang et al. |
| 7,663,226 B2 | 2/2010 | Cho et al. |
| 7,670,940 B2 | 3/2010 | Mizukoshi et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,960 B2 | 3/2010 | Wen |
| 7,682,962 B2 | 3/2010 | Hembree |
| 7,683,460 B2 | 3/2010 | Heitzer et al. |
| 7,692,931 B2 | 4/2010 | Chong et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,800,233 B2 | 9/2010 | Kawano et al. |
| 7,808,093 B2 | 10/2010 | Kagaya et al. |
| 7,808,439 B2 | 10/2010 | Yang et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,857,190 B2 | 12/2010 | Takahashi et al. |
| 7,872,335 B2 | 1/2011 | Khan et al. |
| 7,876,180 B2 | 1/2011 | Uchimura |
| 7,880,290 B2 | 2/2011 | Park |
| 7,892,889 B2 | 2/2011 | Howard et al. |
| 7,902,644 B2 | 3/2011 | Huang et al. |
| 7,910,385 B2 | 3/2011 | Kweon et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 8,008,121 B2 | 8/2011 | Choi et al. |
| 8,012,797 B2 | 9/2011 | Shen et al. |
| 8,018,065 B2 | 9/2011 | Lam |
| 8,020,290 B2 | 9/2011 | Sheats |
| 8,035,213 B2 | 10/2011 | Lee et al. |
| 8,039,316 B2 | 10/2011 | Chi et al. |
| 8,039,970 B2 | 10/2011 | Yamamori et al. |
| 8,053,814 B2 | 11/2011 | Chen et al. |
| 8,053,879 B2 | 11/2011 | Lee et al. |
| 8,058,101 B2 | 11/2011 | Haba et al. |
| 8,071,424 B2 | 12/2011 | Haba et al. |
| 8,071,431 B2 | 12/2011 | Hoang et al. |
| 8,071,470 B2 | 12/2011 | Khor et al. |
| 8,076,770 B2 * | 12/2011 | Kagaya ............... H01L 23/3128 257/698 |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,115,283 B1 | 2/2012 | Bolognia et al. |
| 8,120,054 B2 | 2/2012 | Seo et al. |
| 8,138,584 B2 | 3/2012 | Wang et al. |
| 8,143,141 B2 | 3/2012 | Sugiura et al. |
| 8,174,119 B2 | 5/2012 | Pendse |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,288,854 B2 | 10/2012 | Weng et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,319,338 B1 | 11/2012 | Berry et al. |
| 8,324,633 B2 | 12/2012 | McKenzie et al. |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 | 2/2013 | Co et al. |
| 8,395,259 B2 | 3/2013 | Eun |
| 8,399,972 B2 | 3/2013 | Hoang et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,476,770 B2 | 7/2013 | Shao et al. |
| 8,482,111 B2 | 7/2013 | Haba |
| 8,507,297 B2 | 8/2013 | Pan et al. |
| 8,508,045 B2 | 8/2013 | Khan et al. |
| 8,520,396 B2 | 8/2013 | Schmidt et al. |

(56) References Cited

U.S. PATENT DOCUMENTS

| | | |
|---|---|---|
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,392 B2 | 10/2013 | Chua et al. |
| 8,618,659 B2 | 12/2013 | Sato et al. |
| 8,642,393 B1 | 2/2014 | Yu et al. |
| 8,646,508 B2 | 2/2014 | Kawada |
| 8,653,626 B2 | 2/2014 | Lo et al. |
| 8,653,668 B2 | 2/2014 | Uno et al. |
| 8,659,164 B2 | 2/2014 | Haba |
| 8,669,646 B2 | 3/2014 | Tabatabai et al. |
| 8,670,261 B2 | 3/2014 | Crisp et al. |
| 8,680,677 B2 | 3/2014 | Wyland |
| 8,680,684 B2 | 3/2014 | Haba et al. |
| 8,686,570 B2 | 4/2014 | Semmelmeyer et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson et al. |
| 8,766,436 B2 | 7/2014 | DeLucca et al. |
| 8,772,152 B2 | 7/2014 | Co et al. |
| 8,772,817 B2 | 7/2014 | Yao |
| 8,791,575 B2 | 7/2014 | Oganesian et al. |
| 8,791,580 B2 | 7/2014 | Park et al. |
| 8,796,135 B2 | 8/2014 | Oganesian et al. |
| 8,802,494 B2 | 8/2014 | Lee et al. |
| 8,811,055 B2 | 8/2014 | Yoon |
| 8,816,404 B2 | 8/2014 | Kim et al. |
| 8,816,505 B2 | 8/2014 | Mohammed et al. |
| 8,835,228 B2 | 9/2014 | Mohammed |
| 8,836,136 B2 | 9/2014 | Chau et al. |
| 8,836,147 B2 | 9/2014 | Uno et al. |
| 8,841,765 B2 | 9/2014 | Haba et al. |
| 8,878,353 B2 | 11/2014 | Haba et al. |
| 8,893,380 B2 | 11/2014 | Kim et al. |
| 8,907,466 B2 | 12/2014 | Haba |
| 8,907,500 B2 | 12/2014 | Haba et al. |
| 8,916,781 B2 | 12/2014 | Haba et al. |
| 8,922,005 B2 | 12/2014 | Hu et al. |
| 8,923,004 B2 | 12/2014 | Low et al. |
| 8,927,337 B2 | 1/2015 | Haba et al. |
| 8,946,757 B2 | 2/2015 | Mohammed et al. |
| 8,948,712 B2 | 2/2015 | Chen et al. |
| 8,963,339 B2 | 2/2015 | He et al. |
| 8,975,726 B2 | 3/2015 | Chen et al. |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,012,263 B1 | 4/2015 | Mathew et al. |
| 9,054,095 B2 | 6/2015 | Pagaila |
| 9,093,435 B2 | 7/2015 | Sato et al. |
| 9,095,074 B2 | 7/2015 | Haba et al. |
| 9,105,483 B2 | 8/2015 | Chau et al. |
| 9,117,811 B2 | 8/2015 | Lohni |
| 9,123,664 B2 | 9/2015 | Haba |
| 9,136,254 B2 | 9/2015 | Zhao et al. |
| 9,153,562 B2 | 10/2015 | Haba et al. |
| 9,167,710 B2 | 10/2015 | Mohammed et al. |
| 9,196,586 B2 | 11/2015 | Chen et al. |
| 9,196,588 B2 | 11/2015 | Leal |
| 9,209,081 B2 | 12/2015 | Lim et al. |
| 9,214,434 B1 | 12/2015 | Kim et al. |
| 9,224,647 B2 | 12/2015 | Koo et al. |
| 9,224,717 B2 | 12/2015 | Sato et al. |
| 9,263,394 B2 | 2/2016 | Uzoh et al. |
| 9,263,413 B2 | 2/2016 | Mohammed |
| 9,318,449 B2 | 4/2016 | Hasch et al. |
| 9,318,452 B2 | 4/2016 | Chen et al. |
| 9,324,696 B2 | 4/2016 | Choi et al. |
| 9,330,945 B2 | 5/2016 | Song et al. |
| 9,362,161 B2 | 6/2016 | Chi et al. |
| 9,378,982 B2 | 6/2016 | Lin et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,405,064 B2 | 8/2016 | Herbsommer et al. |
| 9,412,661 B2 | 8/2016 | Lu et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,484,331 B2 | 11/2016 | Paek et al. |
| 9,508,622 B2 | 11/2016 | Higgins, III |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 9,653,428 B1 | 5/2017 | Hiner et al. |
| 9,653,442 B2 | 5/2017 | Yu et al. |
| 9,659,877 B2 | 5/2017 | Bakalski et al. |
| 9,663,353 B2 | 5/2017 | Ofner et al. |
| 9,735,084 B2 | 8/2017 | Katkar et al. |
| 9,788,466 B2 | 10/2017 | Chen |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0040280 A1 | 11/2001 | Funakura et al. |
| 2001/0042925 A1 | 11/2001 | Yamamoto et al. |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0027257 A1 | 3/2002 | Kinsman et al. |
| 2002/0066952 A1 | 6/2002 | Taniguchi et al. |
| 2002/0096787 A1 | 7/2002 | Fjelstad |
| 2002/0113308 A1 | 8/2002 | Huang et al. |
| 2002/0117330 A1 | 8/2002 | Eldridge et al. |
| 2002/0125556 A1 | 9/2002 | Oh et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0068906 A1 | 4/2003 | Light et al. |
| 2003/0094666 A1 | 5/2003 | Clayton et al. |
| 2003/0094685 A1 | 5/2003 | Shiraishi et al. |
| 2003/0094700 A1 | 5/2003 | Aiba et al. |
| 2003/0106213 A1 | 6/2003 | Beaman et al. |
| 2003/0107118 A1 | 6/2003 | Pflughaupt et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2003/0234277 A1 | 12/2003 | Dias et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0041757 A1 | 3/2004 | Yang et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0164426 A1 | 8/2004 | Pai et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1 | 3/2005 | Vu et al. |
| 2005/0062492 A1 | 3/2005 | Beaman et al. |
| 2005/0082664 A1 | 4/2005 | Funaba et al. |

(56) References Cited

U.S. PATENT DOCUMENTS

| | | |
|---|---|---|
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0146008 A1 | 7/2005 | Miyamoto et al. |
| 2005/0151235 A1 | 7/2005 | Yokoi |
| 2005/0151238 A1 | 7/2005 | Yamunan |
| 2005/0161814 A1 | 7/2005 | Mizukoshi et al. |
| 2005/0173805 A1 | 8/2005 | Damberg et al. |
| 2005/0173807 A1 | 8/2005 | Zhu et al. |
| 2005/0176233 A1 | 8/2005 | Joshi et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0087013 A1 | 4/2006 | Hsieh |
| 2006/0088957 A1 | 4/2006 | Saeki |
| 2006/0118641 A1 | 6/2006 | Hwang et al. |
| 2006/0139893 A1 | 6/2006 | Yoshimura et al. |
| 2006/0166397 A1 | 7/2006 | Lau et al. |
| 2006/0197220 A1 | 9/2006 | Beer |
| 2006/0216868 A1 | 9/2006 | Yang et al. |
| 2006/0228825 A1 | 10/2006 | Hembree |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0010086 A1 | 1/2007 | Hsieh |
| 2007/0013067 A1 | 1/2007 | Nishida et al. |
| 2007/0015353 A1 | 1/2007 | Craig et al. |
| 2007/0026662 A1 | 2/2007 | Kawano et al. |
| 2007/0035015 A1 | 2/2007 | Hsu |
| 2007/0045803 A1 | 3/2007 | Ye et al. |
| 2007/0045862 A1* | 3/2007 | Corisis ............... H01L 21/561 257/777 |
| 2007/0080360 A1 | 4/2007 | Mirsky et al. |
| 2007/0090524 A1 | 4/2007 | Abbott |
| 2007/0126091 A1 | 6/2007 | Wood et al. |
| 2007/0145563 A1 | 6/2007 | Punzalan et al. |
| 2007/0148822 A1 | 6/2007 | Haba et al. |
| 2007/0164457 A1 | 7/2007 | Yamaguchi et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0238289 A1 | 10/2007 | Tanaka |
| 2007/0241437 A1 | 10/2007 | Kagaya et al. |
| 2007/0246819 A1 | 10/2007 | Hembree et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0029849 A1 | 2/2008 | Hedler et al. |
| 2008/0032519 A1 | 2/2008 | Murata |
| 2008/0042265 A1 | 2/2008 | Merilo et al. |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Sea et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0110667 A1 | 5/2008 | Ahn et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169544 A1 | 7/2008 | Tanaka et al. |
| 2008/0169548 A1 | 7/2008 | Baek |
| 2008/0211084 A1 | 9/2008 | Chow et al. |
| 2008/0217708 A1 | 9/2008 | Reisner et al. |
| 2008/0230887 A1 | 9/2008 | Sun et al. |
| 2008/0246126 A1 | 10/2008 | Bowles et al. |
| 2008/0277772 A1 | 11/2008 | Groenhus et al. |
| 2008/0280393 A1 | 11/2008 | Lee et al. |
| 2008/0284001 A1 | 11/2008 | Mod et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0008796 A1 | 1/2009 | Eng et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0039523 A1 | 2/2009 | Jiang et al. |
| 2009/0045497 A1 | 2/2009 | Kagaya et al. |
| 2009/0050994 A1 | 2/2009 | Ishihara et al. |
| 2009/0079094 A1 | 3/2009 | Lin |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0115047 A1 | 5/2009 | Raba et al. |
| 2009/0121351 A1 | 5/2009 | Endo |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0166664 A1 | 7/2009 | Park et al. |
| 2009/0166873 A1 | 7/2009 | Yang et al. |
| 2009/0189288 A1 | 7/2009 | Beaman et al. |
| 2009/0194829 A1 | 8/2009 | Chung et al. |
| 2009/0206461 A1 | 8/2009 | Yoon |
| 2009/0212418 A1 | 8/2009 | Gurrum et al. |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0239336 A1 | 9/2009 | Lee et al. |
| 2009/0256229 A1 | 10/2009 | Ishikawa et al. |

(56) References Cited

U.S. PATENT DOCUMENTS

| | | |
|---|---|---|
| 2009/0260228 A1 | 10/2009 | Val |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2009/0316378 A1 | 12/2009 | Haba et al. |
| 2010/0000775 A1 | 1/2010 | Shen et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0007026 A1 | 1/2010 | Shikano |
| 2010/0025835 A1 | 2/2010 | Oh et al. |
| 2010/0032822 A1 | 2/2010 | Liao et al. |
| 2010/0044860 A1 | 2/2010 | Raba et al. |
| 2010/0052135 A1 | 3/2010 | Shim et al. |
| 2010/0052187 A1 | 3/2010 | Lee et al. |
| 2010/0072588 A1 | 3/2010 | Yang |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0148374 A1 | 6/2010 | Castro |
| 2010/0171205 A1 | 7/2010 | Chen et al. |
| 2010/0193937 A1 | 8/2010 | Nagamatsu et al. |
| 2010/0200981 A1 | 8/2010 | Huang |
| 2010/0213560 A1 | 8/2010 | Wang et al. |
| 2010/0216281 A1 | 8/2010 | Pagaila et al. |
| 2010/0224975 A1 | 9/2010 | Shin et al. |
| 2010/0232119 A1 | 9/2010 | Schmidt et al. |
| 2010/0232129 A1 | 9/2010 | Haba et al. |
| 2010/0237471 A1 | 9/2010 | Pagaila et al. |
| 2010/0246141 A1 | 9/2010 | Leung et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0320585 A1 | 12/2010 | Jiang et al. |
| 2010/0327419 A1 | 12/2010 | Muthukumar et al. |
| 2011/0042699 A1 | 2/2011 | Park et al. |
| 2011/0057308 A1 | 3/2011 | Choi et al. |
| 2011/0068453 A1 | 3/2011 | Cho et al. |
| 2011/0068478 A1 | 3/2011 | Pagaila et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0156249 A1 | 6/2011 | Chang et al. |
| 2011/0157834 A1 | 6/2011 | Wang |
| 2011/0175213 A1 | 7/2011 | Mori et al. |
| 2011/0209908 A1 | 9/2011 | Lin et al. |
| 2011/0215472 A1 | 9/2011 | Chandrasekaran |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2011/0272798 A1 | 11/2011 | Lee et al. |
| 2012/0001336 A1 | 1/2012 | Zeng et al. |
| 2012/0007232 A1 | 1/2012 | Haba |
| 2012/0015481 A1 | 1/2012 | Kim |
| 2012/0018885 A1 | 1/2012 | Lee et al. |
| 2012/0020026 A1 | 1/2012 | Oganesian et al. |
| 2012/0025365 A1 | 2/2012 | Haba |
| 2012/0034777 A1 | 2/2012 | Pagaila et al. |
| 2012/0043655 A1 | 2/2012 | Khor et al. |
| 2012/0056312 A1 | 3/2012 | Pagaila et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0086130 A1 | 4/2012 | Sasaki et al. |
| 2012/0104595 A1 | 5/2012 | Haba et al. |
| 2012/0104624 A1 | 5/2012 | Choi et al. |
| 2012/0119380 A1 | 5/2012 | Haba |
| 2012/0126431 A1 | 5/2012 | Kim et al. |
| 2012/0145442 A1 | 6/2012 | Gupta et al. |
| 2012/0146235 A1 | 6/2012 | Choi et al. |
| 2012/0153444 A1 | 6/2012 | Haga et al. |
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2012/0286432 A1* | 11/2012 | Do .......................... H01L 23/13 257/777 |
| 2012/0305916 A1* | 12/2012 | Liu .......................... H01L 22/34 257/48 |
| 2012/0326337 A1 | 12/2012 | Camacho et al. |
| 2013/0001797 A1 | 1/2013 | Choi et al. |
| 2013/0032944 A1 | 2/2013 | Sato et al. |
| 2013/0037802 A1 | 2/2013 | England et al. |
| 2013/0040423 A1 | 2/2013 | Tung et al. |
| 2013/0049218 A1 | 2/2013 | Gong et al. |
| 2013/0049221 A1 | 2/2013 | Han et al. |
| 2013/0069222 A1 | 3/2013 | Camacho |
| 2013/0082399 A1 | 4/2013 | Kim et al. |
| 2013/0087915 A1 | 4/2013 | Warren et al. |
| 2013/0093087 A1 | 4/2013 | Chau et al. |
| 2013/0093088 A1 | 4/2013 | Chau et al. |
| 2013/0093091 A1 | 4/2013 | Ma et al. |
| 2013/0095610 A1 | 4/2013 | Chau et al. |
| 2013/0105979 A1 | 5/2013 | Yu et al. |
| 2013/0134588 A1 | 5/2013 | Yu et al. |
| 2013/0153646 A1 | 6/2013 | Ho |
| 2013/0182402 A1 | 7/2013 | Chen et al. |
| 2013/0200524 A1 | 8/2013 | Han et al. |
| 2013/0200533 A1 | 8/2013 | Chau et al. |
| 2013/0234317 A1 | 9/2013 | Chen et al. |
| 2013/0241083 A1 | 9/2013 | Yu et al. |
| 2013/0256847 A1 | 10/2013 | Park et al. |
| 2013/0313716 A1 | 11/2013 | Mohammed |
| 2013/0323409 A1 | 12/2013 | Read et al. |
| 2014/0021605 A1 | 1/2014 | Yu et al. |
| 2014/0035892 A1 | 2/2014 | Shenoy et al. |
| 2014/0036454 A1 | 2/2014 | Caskey et al. |
| 2014/0103527 A1 | 4/2014 | Marimuthu et al. |
| 2014/0124949 A1 | 5/2014 | Paek et al. |
| 2014/0175657 A1 | 6/2014 | Oka et al. |
| 2014/0220744 A1 | 8/2014 | Damberg et al. |
| 2014/0225248 A1 | 8/2014 | Henderson et al. |
| 2014/0239479 A1 | 8/2014 | Start |
| 2014/0239490 A1 | 8/2014 | Wang |
| 2014/0264945 A1 | 9/2014 | Yap et al. |
| 2014/0312503 A1 | 10/2014 | Seo |
| 2015/0017765 A1 | 1/2015 | Co et al. |
| 2015/0043190 A1 | 2/2015 | Mohammed et al. |
| 2015/0044823 A1 | 2/2015 | Mohammed |
| 2015/0076714 A1 | 3/2015 | Haba et al. |
| 2015/0130054 A1 | 5/2015 | Lee et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0225692 A1 | 8/2016 | Kim et al. |
| 2017/0117231 A1 | 4/2017 | Awujoola et al. |
| 2017/0229432 A1 | 8/2017 | Lin et al. |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| DE | 102009001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 | 10/1984 |
| JP | 61125062 A | 6/1986 |
| JP | S62158338 A | 7/1987 |
| JP | 62-226307 | 10/1987 |
| JP | 1012769 A | 1/1989 |

(56) References Cited

FOREIGN PATENT DOCUMENTS

| | | |
|---|---|---|
| JP | 64-71162 | 3/1989 |
| JP | H04-346436 A | 12/1992 |
| JP | 06268015 A | 9/1994 |
| JP | H06268101 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 1118364 | 1/1999 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |
| JP | 11317476 | 11/1999 |
| JP | 2000156461 A | 6/2000 |
| JP | 2000323516 A | 11/2000 |
| JP | 3157134 B2 | 4/2001 |
| JP | 2001196407 A | 7/2001 |
| JP | 2001326236 A | 11/2001 |
| JP | 2002050871 A | 2/2002 |
| JP | 2002289769 A | 10/2002 |
| JP | 2003122611 A | 4/2003 |
| JP | 2003-174124 A | 6/2003 |
| JP | 2003197668 A | 7/2003 |
| JP | 2003307897 A | 10/2003 |
| JP | 2003318327 A | 11/2003 |
| JP | 2004031754 A | 1/2004 |
| JP | 200447702 | 2/2004 |
| JP | 2004047702 A | 2/2004 |
| JP | 2004048048 A | 2/2004 |
| JP | 2004-172157 A | 6/2004 |
| JP | 2004200316 A | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005093551 A | 4/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007194436 A | 8/2007 |
| JP | 2007234845 A | 9/2007 |
| JP | 2007287922 A | 11/2007 |
| JP | 2007-335464 A | 12/2007 |
| JP | 2007335464 A | 12/2007 |
| JP | 200834534 A | 2/2008 |
| JP | 2008166439 A | 7/2008 |
| JP | 2008171938 A | 7/2008 |
| JP | 2008235378 A | 10/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009-508324 A | 2/2009 |
| JP | 2009044110 A | 2/2009 |
| JP | 2009506553 | 2/2009 |
| JP | 2009064966 A | 3/2009 |
| JP | 2009088254 A | 4/2009 |
| JP | 2009111384 A | 5/2009 |
| JP | 2009528706 A | 8/2009 |
| JP | 2009260132 A | 11/2009 |
| JP | 2010103129 A | 5/2010 |
| JP | 2010135671 A | 6/2010 |
| JP | 2010192928 A | 9/2010 |
| JP | 2010199528 A | 9/2010 |
| JP | 2010206007 A | 9/2010 |
| JP | 2011514015 A | 4/2011 |
| JP | 2011166051 A | 8/2011 |
| KR | 100265563 | 9/2000 |
| KR | 20010061849 A | 7/2001 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20070058680 A | 6/2007 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 101215271 B1 | 12/2012 |
| KR | 20130048810 A | 5/2013 |
| KR | 20150012285 A | 2/2015 |
| TW | 200539406 A | 12/2005 |
| TW | 200721327 A | 6/2007 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| TW | I605558 B | 11/2017 |
| WO | 9615458 A1 | 5/1996 |
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007083351 A1 | 7/2007 |
| WO | 2007101251 A2 | 9/2007 |
| WO | 2007116544 A1 | 10/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010014103 A1 | 2/2010 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

North Corporation, "Processed Intra-layer Interconnection Material for PWBs [Etched Copper Bump with Copper Foil]," NMBITM, Version Jun. 2001.

Kim et al., "Application of Through Mold Via (TMV) as PoP base package", 6 pages (2008).

International Search Report, PCT/US2005/039716, dated Apr. 5, 2006.

International Search Report Application No. PCT/US2011/024143, dated Sep. 14, 2011.

Korean Search Report KR10-2011-0041843 dated Feb. 24, 2011.

International Search Report and Written Opinion PCT/US2011/044342 dated May 7, 2012.

Bang, U.S. Appl. No. 10/656,534, filed Sep. 5, 2003.

International Search Report and Written Opinion for Application No. PCT/US2011/044346 dated May 11, 2012.

Partial International Search Report from Invitation to Pay Additional Fees for Application No. PCT/US2012/028738 dated Jun. 6, 2012.

(56) References Cited

OTHER PUBLICATIONS

Korean Office Action for Application No. 10-2011-0041843 dated Jun. 20, 2011.
"EE Times Asia" [online]. [Retrieved Aug. 5, 2010]. Retrieved from internet. <http://www.eetasia.com/ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, STATS ChipPAC Ltd.
Search Report from Korean Patent Applicatin No. 10-2010-0113271 dated Jan. 12, 2011.
International Search Report and Written Opinion for PCT/US2011/060551 dated Apr. 18, 2012.
Meiser S, "Klein Und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2013.
Partial International Search Report for Application No. PCT/US2013/026126 dated Jun. 17, 2013.
International Search Report and Written Opinion for Application No. PCT/US2013/026126 dated Jul. 25, 2013.
Extended European Search Report for Application No. EP13162975 dated Sep. 5, 2013.
International Search Report and Written Opinion for Application No. PCT/US2013/052883 dated Oct. 21, 2013.
Japanese Office Action for Application No. 2013-509325 dated Oct. 18, 2013.
Office Action from U.S. Appl. No. 12/769,930 dated May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20, 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Taiwanese Office Action for Application No. 101138311 dated Jun. 27, 2014.
Chinese Office Action for Application No. 201180022247.8 dated Sep. 16, 2014.
International Search Report and Written Opinion for Application No. PCT/US2011/024143 dated Jan. 17, 2012.
Taiwanese Office Action for Application No. 100140428 dated Jan. 26, 2015.
Korean Office Action for Application No. 2014-7025992 dated Feb. 5, 2015.
Japanese Office Action for Application No. 2013-520776 dated Apr. 21, 2015.
International Search Report and Written Opinion for Application No. PCT/US2015/011715 dated Apr. 20, 2015.
Chinese Office Action for Application No. 201180022247.8 dated Apr. 14, 2015.
Japanese Office Action for Application No. 2013-520777 dated May 22, 2015.
Chinese Office Action for Application No. 201310264264.3 dated May 12, 2015.
Partial International Search Report for Application No. PCT/US2015/033004 dated Sep. 9, 2015.
Taiwanese Office Action for Application No. 102106326 dated Sep. 18, 2015.
International Preliminary Report on Patentability, Chapter II, for Application No. PCT/US2014/055695 dated Dec. 15, 2015.
International Search Report and Written Opinion for Application No. PCT/US2014/014181 dated Jun. 13, 2014.
International Search Report and Written Opinion for Application No. PCT/US2014/050125 dated Feb. 4, 2015.
International Search Report and Written Opinion for Application No. PCT/US2014/050148 dated Feb. 9, 2015.
International Search Report and Written Opinion for Application No. PCT/US2014/055695 dated Mar. 20, 2015.
Partial International Search Report for Application No. PCT/US2014/014181 dated May 8, 2014.
Taiwanese Office Action for Application No. 103103350 dated Mar. 21, 2016.
U.S. Appl. No. 13/477,532, filed May 22, 2012.
Written Opinion for Application No. PCT/US2014/050125 dated Jul. 15, 2015.
International Search Report for Application No. PCT/US2015/032679, dated Nov. 11, 2015, 2 pages.
International Search Report for Application No. PCT/US2016/056402, dated Jan. 31, 2017, 3 pages.
International Search Report for Application No. PCT/US2016/056526, dated Jan. 20, 2017, 3 pages.
International Search Report for Application No. PCT/US2016/068297, dated Apr. 17, 2017, 3 pages.
Partial International Search Report for Application No. PCT/US2015/032679, dated Sep. 4, 2015, 2 pages.
Chinese Office Action Search Report for Application No. 2014800551784 dated Jan. 23, 2018, 3 pages.
Brochure, "High Performance BVA PoP Package for Mobile Systems," Invensas Corporation, May 2013, 20 pages.
Brochure, "Invensas BVA PoP for Mobile Computing: 100+ GB/s BVA PoP," Invensas Corporation, c. 2012, 2 pages.
Brochure, "Invensas BVA PoP for Mobile Computing: Ultra High IO Without TSVs," Invensas Corporation, Jun. 26, 2012, 4 pages.
Campos et al., "System in Package Solutions Using Fan-Out Wafer Level Packaging Technology," SEMI Networking Day, Jun. 27, 2013, 31 pages.
Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
NTK HTCC Package General Design Guide, Communication Media Components Group, NGK Spark Plug Co., Ltd., Komaki, Aichi, Japan, Apr. 2010, 32 pages.
European Search Results under Rule 164(2)(b) EPC for Application No. 12712792 dated Feb. 27, 2018, 2 pages.
International Seach Report for Application No. PCT/US2017/064437 dated Mar. 29, 2018, 5 pages.
Taiwanese Search Report for Application No. TW105128420 dated Sep. 26, 2017.

* cited by examiner

BVA INTERPOSER

CROSS-REFERENCE TO RELATED APPLICATIONS

This application is a continuation of U.S. patent application Ser. No. 13/795,756, filed on Mar. 12, 2013, which claims the benefit of the filing date of U.S. Provisional Application No. 61/679,653, filed on Aug. 3, 2012, the disclosures of which are incorporated herein by reference.

BACKGROUND OF THE INVENTION

The present application describes an interposer such as that which can be incorporated into a microelectronic assembly which may include an unpackaged semiconductor die or packaged semiconductor die, as well as methods for making such interposer. Specifically, an interposer and a method of making an interposer are described herein which incorporates a bond via array, e.g., an array of vertically extending wire bonds having ends uncovered at a major surface of an encapsulation such as a molded encapsulation.

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent to each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

An interposer can be provided as an interconnection element having contacts and top and bottom surfaces thereof electrically connected with one or more packaged or unpackaged semiconductor dies at one of the top or bottom surface thereof, and electrically connected with another component at the other one of the top or bottom surfaces. The other component may in some cases be a package substrate which in turn may be electrically connected with another component which may be or may include a circuit panel.

Despite all of the above-described advances in the art, still further improvements in interposers and methods of making interposers would be desirable.

SUMMARY OF THE INVENTION

In accordance with an aspect of the invention, a method for making an interposer is provided. In accordance with such aspect, a plurality of wire bonds having first extremities may be formed. The first extremities may include bases bonded to one or more surfaces of a first element. The wire bonds may include second extremities opposite from the first extremities. The wire bonds may have edge surfaces extending between the first and second extremities. In accordance with such aspect, a dielectric encapsulation may contact the edge surfaces and separate adjacent wire bonds from one another.

At least portions of the first element may then be removed during further processing. After the further processing, the interposer having first and second opposite sides separated from one another by at least the encapsulation may be provided. The interposer may have first contacts and second contacts at the first and second opposite sides, respectively, for connection with first and second components, respectively. The first contacts of the interposer may be electrically connected with the second contacts through the wire bonds.

In some aspects, the first element may include a metal layer having the one or more surfaces. In such aspects, the metal layer may be partially removed during the removal of the portions of the first element such that the bases remain bonded to second portions of the metal layer remaining after the portions of the first element are removed.

In some aspects, the metal may be patterned when the metal layer is removed to form first conductive elements insulated from one another by at least portions of the encapsulation layer during the partial removal of the metal layer. In such aspects, the bases of at least some of the wire bonds may remain bonded to the first conductive elements.

In some aspects, the first element may include a metal layer having the one or more surfaces. In such aspects, the metal layer may be fully removed during the removal of the portions of the first element are removed so as to expose at least portions of the bases.

In some aspects, the first element may include a metal layer having the one or more surfaces. In such aspects, the encapsulation may be subjected to grinding, lapping or polishing at a surface of the encapsulation during the removal of the portions of the first element.

In some aspects, at least portions of the bases of the wire bonds are at one of the first or second sides of the interposer as the first contacts or the second contacts.

In some aspects, at least portions of at least one of the first and second extremities of the wire bonds other than the bases are at at least one of the first and second sides of the interposer as at least one of the first contacts and the second contacts.

In some aspects, electrically conductive structure may be formed electrically connecting the first extremities of the wire bonds with the first contacts.

In some aspects, a dielectric layer overlying the encapsulation may be formed. In such aspects, a surface of the dielectric layer may be at the first side of the interposer. In such aspects, the electrically conductive structure may be formed extending along the dielectric layer.

In some aspects, each of at least some first contacts may be offset from the first extremity of the wire bond to which it may be electrically connected. In such aspects, the conductive structure may have at least a portion extending in a lateral direction between the first contact and the wire bond connected to the first contact.

In some aspects, the electrically conductive structure may be formed electrically connecting the second extremities of the wire bonds with the second contacts.

In such aspects, a dielectric layer overlying the encapsulation may be formed. In such aspects, a surface of the dielectric layer may be at the first side of the interposer. In such aspects, the electrically conductive structure may be formed extending along the dielectric layer.

In such aspects, each of at least some second contacts may be offset from the second extremity of the wire bond to which it may be electrically connected. In such aspects, at least a portion of the conductive structure may be formed extending in a lateral direction between the second contact and the wire bond connected to the second contact.

In some aspects, electrically conductive structure may be formed electrically connecting the second extremities of the wire bonds with the second contacts.

In some aspects, a dielectric layer overlying the encapsulation may be formed. In such aspects, a surface of the dielectric layer may be at the first side of the interposer. In such aspects, the electrically conductive structure may be formed extending along the dielectric layer.

In some aspects, each of at least some second contacts may be offset from the second extremity of the wire bond to which it may be electrically connected. In such aspects, the conductive structure may have at least a portion extending in a lateral direction between the second contact and the wire bond connected to the second contact.

In some aspects, at least some of the second extremities of the wire bonds may be displaced in at least one lateral direction parallel to the second surface from their respective first extremities of the wire bonds.

In some aspects, the bases may be arranged in a first pattern that may have a first minimum pitch. In such aspects, the unencapsulated portions of the wire bonds may be arranged in a pattern having a second minimum pitch that is greater than the first minimum pitch.

In some aspects, the bases may be arranged in a first pattern having a first minimum pitch. In such aspects, the unencapsulated portions of the wire bonds may be arranged in a pattern having a second minimum pitch that is less than the first minimum pitch.

In some aspects, the bases of the wire bonds may be in the form of ball bonds.

In some aspects, first conductive elements may formed during the selective removal of portions of the conductive layer as contact pads to which bases of wire bonds that are not electrically connected with other elements of the first element are electrically connected.

In some aspects, the first element is thinned by one of grinding or polishing.

In some aspects, the encapsulation layer may be formed having an initial thickness such that the end surfaces of the wire bonds are substantially covered. In such aspects, a portion of the encapsulation layer may be removed during the thinning of the first element such that the end surfaces are unencapsulated by the encapsulation layer.

In some aspects, an encapsulant may be molded during the forming of the encapsulation layer in contact with the first element and at least edge surfaces of the wire bonds.

In some aspects, the metal layer may have a thickness of less than 20 microns.

In some aspects, the dielectric encapsulation may have first and second oppositely-facing surfaces. In such aspects, the interposer may have a through opening extending between the first and second oppositely-facing sides. The opening may be dimensioned to receive an entire major surface of a microelectronic element.

In some aspects, the interposer may have at least one peripheral edge surface extending between the first and second sides. In such aspects, the wire bonds may be disposed within a portion of the encapsulation between the through opening and the at least one peripheral edge surface.

In some aspects, the one or more peripheral edge surfaces may be defined by first and second oppositely-facing outer faces and third and fourth oppositely-facing outer faces intersecting each of the first and second oppositely-facing outer surfaces. In such aspects, the through opening may be defined by first and second oppositely-facing inner faces and third and fourth oppositely-facing inner faces intersecting each of the first and second oppositely-facing inner faces.

In accordance with an aspect of the invention, an interposer is provided. The interposer may include a dielectric encapsulation that may have first and second oppositely facing surfaces. The interposer may further include a plurality of wire bonds each separated from one another by the encapsulation. Each of the wire bonds may have first and second opposite extremities not fully covered by the encapsulation at the first and second surfaces, respectively. Each of the wire bonds may have an edge surface between the first and second extremities that may be contacted by the encapsulation and that may be separated from the edge surfaces of adjacent wire bonds by the encapsulation. At least one of the extremities of each wire bond may be a base of such wire bond.

The interposer may have first and second opposite sides. The interposer may further have first contacts and second contacts at the first and second opposite sides, respectively, for electrical connection with first and second components, respectively. The first contacts may be electrically connected with the second contacts through the wire bonds.

In some aspects, at least portions of the bases of the wire bonds may be at one of the first or second sides of the interposer as the first contacts or the second contacts.

In some aspects, at least portions of at least one of the first or second extremities of the wire bonds other than the bases may be at at least one of the first or second sides of the interposer as at least one of the first contacts or the second contacts.

In some aspects, a dielectric layer may overly the first surface of the encapsulation. In such aspects, the dielectric layer may have an exposed surface. In such aspects, the interposer further may include conductive structure electrically connecting the first extremities of the wire bonds with the first contacts.

In some aspects, each of at least some first contacts may be offset from the first extremity of the wire bond to which it may be electrically connected. In such aspects, the conductive structure may have at least a portion extending in a lateral direction between the first contact and the wire bond connected to the first contact.

In some aspects, a dielectric layer may overly the second surface of the encapsulation. In such aspects, the dielectric layer may have an exposed surface. In such aspects, the interposer further may include conductive structure electrically connecting the second extremities of the wire bonds with the second contacts.

In some aspects, each of at least some second contacts may be offset from the second extremity of the wire bond to which it may be electrically connected. In such aspects, the conductive structure may have at least a portion extending in a lateral direction between the second contact and the wire bond connected to the second contact.

In some aspects, a second dielectric layer may overly the second surface of the encapsulation. In such aspects, the second dielectric layer may have an exposed surface. In such aspects, the interposer further may include conductive structure electrically connecting the second extremities of the wire bonds with the second contacts.

In such aspects, each of at least some second contacts may be offset from the second extremity of the wire bond to which it may be electrically connected. In such aspects, the conductive structure may have at least a portion extending in a lateral direction between the second contact and the wire bond connected to the second contact.

In some aspects, at least some of the second extremities of the wire bonds may be displaced in at least one lateral direction parallel to the second surface from their respective first extremities thereof.

In some aspects, a microelectronic assembly may be provided. The microelectronic assembly may include the interposer in accordance with one or more aspects of the invention. The microelectronic assembly may further include a first component that may have first component contacts electrically connected with the first contacts. The microelectronic assembly may further include a second component. The second component may have a face and a plurality of second component contacts on the face facing and electrically connected with the second contacts.

In some aspects, the second component may be a microelectronic element. In such aspects, the second component contacts may be element contacts at the face of the microelectronic element.

In some aspects, the microelectronic element may be a first microelectronic element. In such aspects, the microelectronic assembly may further include a second microelectronic element. The second microelectronic element may have a face and a plurality of second element contacts on the face facing and electrically connected with the second contacts.

In some aspects in which a microelectronic assembly is provided, the interposer further may include electrically conductive structure on the interposer. The electrically conductive structure may extend in a lateral direction parallel to the first and second sides. At least some of the first element contacts may be electrically connected with at least some of the second element contacts through the structure.

In some aspects in which a microelectronic assembly is provided, a thickness of the interposer between the first and second sides may be less than one millimeter.

In some aspects, the first component may be a circuit panel.

In some aspects, the contacts of the circuit panel may face the first contacts. Such contacts may be bonded to the first contacts with an electrically conductive bond material.

In some aspects, the electrically conductive bond material may include at least one reflowable bond metal.

In some aspects, the second component may be a microelectronic package. In such aspects, the second component contacts may be a plurality of terminals at the face of the microelectronic package. In such aspects, the microelectronic package may include a microelectronic element having a plurality of element contacts on a face of the microelectronic element electrically connected with the second component contacts.

In some aspects, a system may be provided that includes the microelectronic assembly and one or more third components electrically connected with the microelectronic assembly.

In accordance with an aspect of the invention, an interposer is provided. The interposer may include a dielectric encapsulation that may have first and second oppositely-facing surfaces. The dielectric encapsulation may have a through opening that may extend between the first and second oppositely-facing surfaces. The opening may be dimensioned to receive an entire major surface of a microelectronic element.

The interposer further may include a plurality of wire bonds for electrical connection with first and second components. The wire bonds may be separated from one another by the encapsulation. Each of the wire bonds may have first and second opposite extremities at least not completely covered by the encapsulation at at least one of the first and second oppositely-facing surfaces, respectively. Each of the wire bonds further may have an edge surface between the first and second extremities contacted by the encapsulation. Each of the wire bonds may be separated from edge surfaces of adjacent wire bonds by the encapsulation.

In some aspects, the interposer may include first and second oppositely-facing sides separated from one another by at least the first and second oppositely-facing surfaces of the dielectric encapsulation, respectively.

In some aspects, the interposer may include first and second contacts at the first and second opposite sides, respectively, for electrical connection with first and second components, respectively. The first contacts may be electrically connected with the second contacts through the wire bonds.

In some aspects, the interposer may include at least one conductive structure. At least some of the conductive structures may have at least a portion that may extend in a lateral direction from and that may electrically connect one of the plurality of first extremities of the plurality of wire bonds to a corresponding one of the first contacts. In such aspects, the corresponding one of the first contacts may be offset from the one of the plurality of first extremities.

In some aspects, the interposer may include at least a second conductive structure. The second conductive structure may include at least a portion that may extend in a lateral direction from and that may electrically connect one of the plurality of second extremities of the plurality of wire bonds to a corresponding one of the second contacts. In such aspects, the corresponding one of the second contacts may be offset from the one of the plurality of second extremities.

In some aspects, the thickness of the interposer between the first and second oppositely-facing sides may be less than one millimeter.

In some aspects, a stacked microelectronic assembly may be provided. The stacked microelectronic assembly may include the interposer for electrical connection with the first and second components in accordance with one or more aspects of the invention. In such aspects, the first component may be a first microelectronic package. The microelectronic package may include a plurality of first terminals. In such aspects, the second component may be a second microelectronic package. The second microelectronic package may include a plurality of second terminals. The second microelectronic package may be electrically connected with the first microelectronic package through the interposer.

The first microelectronic package may include a surface facing the first side of the interposer. The second microelectronic package may include a surface facing the second side of the interposer. At least some of the respective plurality of first terminals of the first microelectronic package may be electrically connected with corresponding first extremities of the plurality of wire bonds of the interposer. At least some of the respective plurality of second terminals of the second microelectronic package may be electrically connected with corresponding second extremities of the plurality of wire bonds of the interposer.

In some aspects, the first microelectronic package may include a first microelectronic element. A major surface of the first microelectronic element may be received within the through opening. The first microelectronic element may include first element contacts electrically connected to the second microelectronic package through the interposer.

In some aspects, the second microelectronic package may include a second microelectronic element. The second microelectronic element may include second element contacts electrically connected to the first microelectronic package through the interposer.

In some aspects, the first element contacts may be electrically connected to the interposer through a plurality of first conductive elements at least one of overlying and embedded at least partially within a redistribution structure. The redistribution structure may include a redistribution dielectric layer overlying the dielectric encapsulation of the interposer and may include a plurality of second conductive elements through the redistribution dielectric layer.

In such aspects, the first element contacts may be electrically connected to joining elements on an opposite side of the redistribution structure.

In some aspects, the through opening may be filled with encapsulation to fix the location of the interposer relative to the first microelectronic element.

In some aspects, the first microelectronic package may be a circuit panel.

In accordance with an aspect of the invention, a method of forming a stacked microelectronic assembly is provided. In accordance with such aspect, a first component may be placed to face a first side of an interposer. A plurality of first terminals may be on the first component. The interposer may have a second side facing in an opposite direction from the first side. The first and second sides of the interposer may be separated by at least first and second oppositely-facing surfaces of a dielectric encapsulation, respectively.

The interposer may include a through opening extending between the first and second oppositely-facing sides. The opening may be dimensioned to receive an entire major surface of a microelectronic element. The interposer may include a plurality of wire bonds for electrical connection with first and second components. The wire bonds may be separated from one another by the encapsulation. Each of the wire bonds may have first and second opposite extremities at least not completely covered by the encapsulation at at least one of the first and second oppositely-facing surfaces, respectively. Each of the wire bonds may have an edge surface between the first and second extremities that may be contacted by the encapsulation and that may be separated from edge surfaces of adjacent wire bonds by the encapsulation.

The first extremities of at least some wire bonds of the interposer may be connected to at least some of the plurality of first terminals on the first component.

A second component may be placed to face the second side of the interposer. A plurality of second terminals may be on the second component.

The second component may be connected to the second extremities of at least some of the plurality of wire bonds.

In some aspects, the first component may be a first microelectronic package. The plurality of first terminals may be located along a first connection surface of the microelectronic package. The first extremities of at least some of the plurality of wire bonds may be physically connected to at least some of the plurality of first terminals of the first microelectronic package.

In some aspects, the second component may be a second microelectronic package. The second microelectronic package may have a conductive layer along a second connection surface of the second microelectronic package. A plurality of second terminals may be located along a third connection surface of the second microelectronic package. In such aspects, the second extremities of at least some of the plurality of wire bonds may be physically connected to the second microelectronic package at the conductive layer of the second microelectronic package.

In some aspects, the interposer may include first and second contacts at the first and second opposite sides, respectively. The first contacts may be electrically connected with the second contacts through the wire bonds. In such aspects, at least one conductive structure may be formed. The one or more conductive structures may have at least a portion that may extend in a lateral direction from and that may electrically connect one of the plurality of first extremities of the plurality of wire bonds to a corresponding one of the first contacts. The corresponding one of the first contacts may be offset from such plurality of first extremities.

In such aspects, at least a second conductive structure may be formed. The second conductive structure may have at least a portion that may extend in a lateral direction from and that may electrically connect one of the plurality of second extremities of the plurality of wire bonds to a corresponding one of the second contacts. The corresponding one of the second contacts may be offset from the one of the plurality of second extremities.

In some aspects, the first microelectronic package may include a first microelectronic element. In such aspects, the first microelectronic element may be mounted on a portion of the first component exposed within the through opening of the interposer.

In some aspects, the first microelectronic element may be thinned to a predetermined thickness no greater than the thickness of the interposer.

In such aspects, the thinning of the microelectronic element may be performed prior to or after insertion into the interposer.

In some aspects, the first connection surface of the first microelectronic package may be abutted with the first surface of the interposer such that the first connection surface is flush against the interposer.

DETAILED DESCRIPTION

Figure 1:
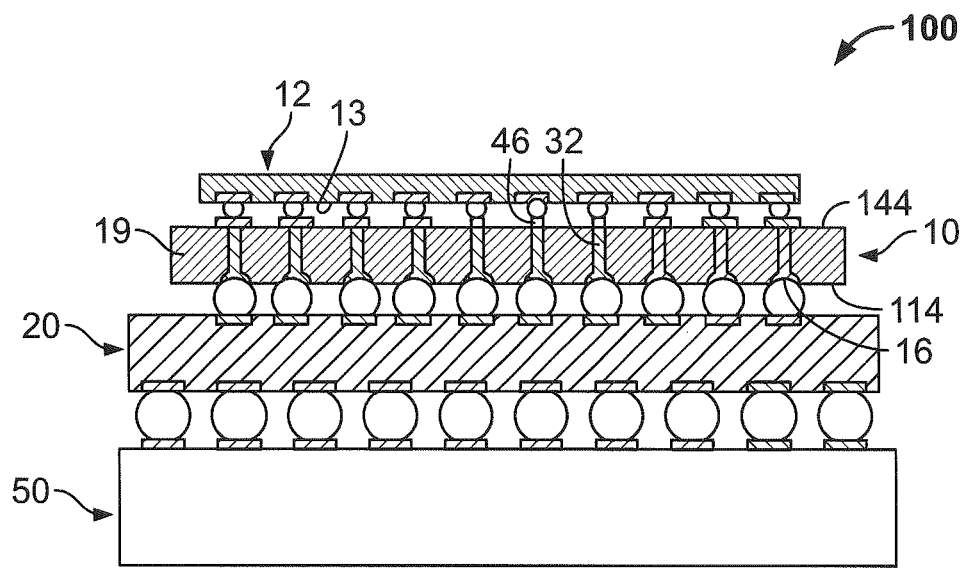
FIG. 1 is a sectional view of a microelectronic assembly including an interposer in accordance with an embodiment of the present invention.

Turning now to the figures, where similar numeric references are used to indicate similar features, there is shown in FIG. 1 a microelectronic assembly 100 according to an embodiment of the present invention. The embodiment of FIG. 1 is a microelectronic assembly which includes an interposer 10 having first and second oppositely facing sides 144, 114, e.g., top and bottom surfaces, at which first and second contacts 46, 16, are provided, respectively, for electrical connection with first and second components of the microelectronic assembly, respectively. Components described herein such as interposers, substrates, circuit panels, microelectronic elements, and the like have dielectric structure at external surfaces thereof. Accordingly, as used in this disclosure, a statement that an electrically conductive element is "at" a surface of dielectric structure of a component, indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a component may project from such surface; may be flush with such surface; or may be recessed relative to such surface in a hole or depression in the component.

As shown in FIG. 1, the first component can be a component having active circuit elements thereon, such as a microelectronic element 12, for example, or other component. A microelectronic element can be a packaged or unpackaged semiconductor die which has a face 13 facing towards the first side 144 of the interposer 10 and be packaged or unpackaged as connected to the first contacts 46 of the interposer. As further shown in FIG. 1, the second contacts 16 of the interposer can be electrically connected with corresponding contacts of another component of the assembly which can be a package substrate 20 in the example illustrated in FIG. 1. Electrical connections between the first and second contacts 46, 16 are provided through wire bonds 32 which are separated from one another and extend in a direction of a thickness of the interposer between the first and second oppositely facing sides 144, 114.

As an alternative to the arrangement shown in FIG. 1 or in addition thereto, some or all of the second contacts 16 may be connected with a second unpackaged or packaged semiconductor die having a surface facing the second side 114 of the interposer.

A package substrate 20 or other component interconnected with the interposer 10 can, in turn be mounted to contacts 52 of a circuit panel 50, as shown in FIG. 1.

Figure 2:
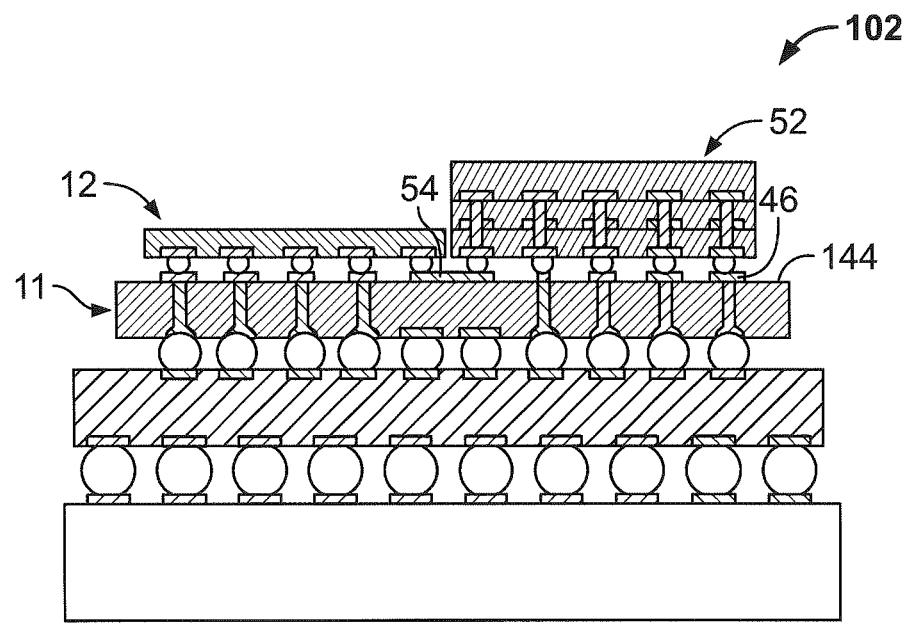
FIG. 2 is a sectional view of a microelectronic assembly including an interposer in accordance with an embodiment of the present invention.

FIG. 2 illustrates a microelectronic assembly 102 according to a further example in which first and second microelectronic elements 12, 52 can be electrically interconnected with an interposer 11 through first contacts 46 at a first side 144 of the interposer 11. The semiconductor dies, which may be packaged or unpackaged, may be electrically interconnected with one another through conductive structure provided on the interposer, such as traces 54 thereon, which may extend in a direction parallel to the first and second sides 144, 114 of the interposer.

Figure 3:
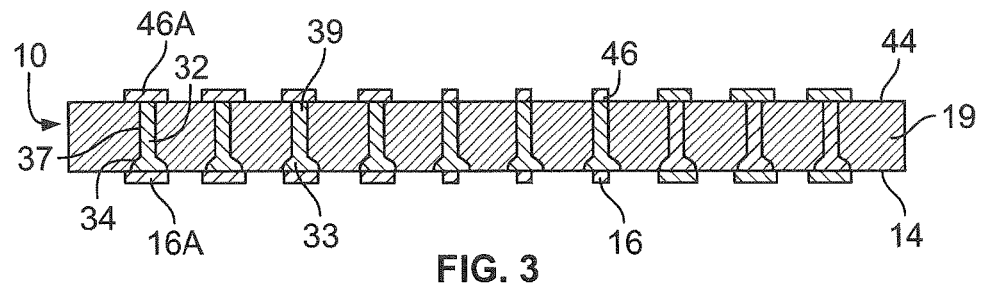
FIG. 3 is a sectional view of an interposer in accordance with an embodiment of the present invention.
Figure 4:
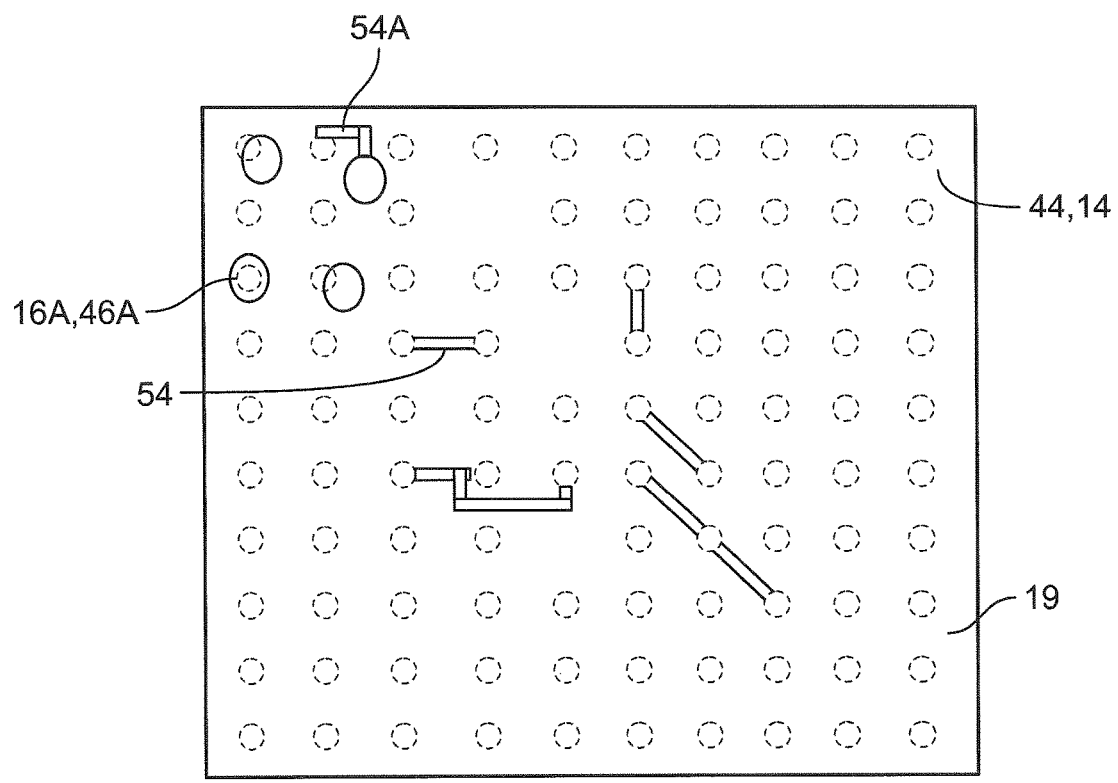
FIG. 4 is a plan view of an interposer in accordance with an embodiment of the present invention.
Figure 5:
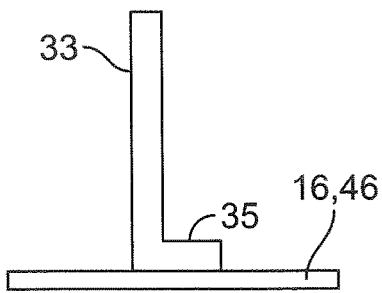
FIGS. 5-10 are sectional views of various arrangements of wire bonds formed by techniques such as stitch bonding, wedge bonding, or ball bonding for use in an interposer in accordance with embodiments of the present invention.
Figure 6:
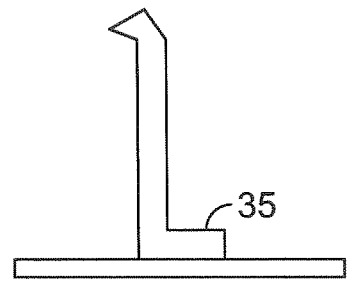
Figure 7:
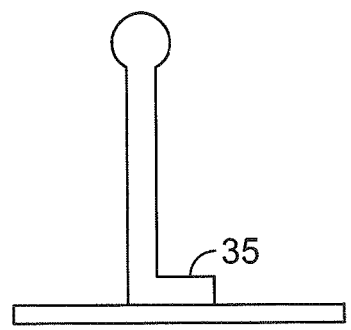

Referring to FIG. 3, a sectional view is shown further illustrating an interposer 10 as can be incorporated in a microelectronic assembly such as shown in FIG. 1 or FIG. 2, and FIG. 4 is a corresponding plan view looking toward either a top surface 44 or, alternatively, a bottom surface 14 of an encapsulation 19 of the interposer. As seen in FIGS. 3 and 4, the first and second contacts 46, 16 can be made to extend in a lateral direction parallel to the top or bottom surfaces 44, 14 beyond an edge surface 37 of the respective wire bond 32, as seen in the case of contacts 46A and 16A. The insulating encapsulation 19, typically made of dielectric material can be provided by injecting an encapsulant material into a mold which at least partially encloses a structure having the wire bonds 32 bonded to one or more surfaces thereto, in which case, as used herein, the encapsulation is a "molded encapsulation". The wire bonds 32 can be formed by bonding wires to one or more surfaces such as surfaces of contacts, or to a surface of a sheet, e.g., metal sheet, as described, for example, in commonly owned U.S. application Ser. Nos. 13/462,158, 13/404,408, 13/404,458, 13/563, 085, 13/477,532 and 13/405,125. As best shown in FIG. 3, in some cases, traces 54, 54A may overlie one or both of oppositely-facing top and bottom surfaces 44, 14 of the encapsulation 19, or may be embedded within one or more dielectric layers overlying one or both such surfaces of the encapsulation, as further seen in FIG. 20, for example. Referring again to FIG. 2, an assembly including multiple semiconductor dies, which in some cases may be vertically stacked and electrically interconnected as illustrated, can be electrically interconnected with interposer 11 through first contacts 46, and may be further electrically interconnected with another die 12 or packaged die of the microelectronic assembly through traces 54.

Referring again to FIG. 3, the wire bonds 32 which provide electrical interconnections in a direction extending through the encapsulation 19 between the first and second surfaces 44 and 14 of the encapsulation are typically formed by forming wire bonds by bonding metal wire to one or more surfaces at different locations thereof, which may be locations of an array, and which may be surfaces of a metal layer disposed therebelow. Each wire bond has a first extremity 33 defining an end thereof and a second extremity 39 defining a second end of the wire bond opposite the first end. The wire bonds typically have cylindrical shafts extending between the first and second extremities, and edge surfaces 37 extending in a direction between the first and second extremities of each wire bond.

In a particular example, a bonding tool can bond the metal wire to an exposed surface of a layered structure which includes an unpatterned or patterned metal sheet, and which may include one or more finish metal layers thereon. Thus, in one example, wire bonds can be formed on a base having a metal layer of aluminum, copper or alloy thereof or the like, and the finish layers in one example, may include an "ENIG" finish, such as a layer of nickel deposited on the base metal by electroless deposition, followed by a layer of gold deposited on the nickel layer by an immersion process. In another example, the base metal layer can have an "ENEPIG" finish, such as may be a combination of a layer of electrolessly deposited nickel deposited on the base metal, followed by a layer of electrolessly deposited palladium deposited thereon, and followed by a layer of gold deposited on the palladium by an immersion process.

Wire bonds can be formed by bonding a metal wire to a surface by a technique as previously described in one or more of the aforementioned commonly owned and incorporated United States Applications. As used herein, the "base" 34 of a wire bond means a portion of a wire bond other than a typically cylindrically shaped shaft of a wire bond which results from bonding such portion of a metal wire to a surface. The base 34 can be formed by ball bonding a metal wire to the surface, such as by heating the wire at a tip thereof to form a ball of molten metal and contacting the surface with the ball to form the ball bond so as to form a bulbous portion of the wire as a base 34, as shown in FIG. 3 for example. In such example, the base of the wire bond may have a shape similar to a ball or a portion of a ball when the base is formed by ball bonding. A wire bond having a base formed by ball bonding may have a shape and may be formed as described, for example, in U.S. patent application Ser. No. 13/462,158, the disclosure of which is incorporated by reference herein.

Alternatively, as seen in FIG. 5, 6, 7, or 8, the base 35 can be formed by other techniques such as stitch bonding or wedge bonding, in which a portion of the edge surface of a wire is bonded to a surface such as contacts 16, 46. In such arrangements, the base 35 may have a somewhat flattened cylindrical shape which may extend at a substantial angle (e.g., 15 to 90 degrees) away from the shaft. A wire bond having a base formed by stitch or wedge bonding may have a shape generally as seen in FIGS. 5, 6, 7 and 8, and may be formed as described, for example, in U.S. patent application Ser. Nos. 13/404,408; 13/404,458; 13/405,125, the disclosures of which are incorporated by reference herein. An upwardly extending shaft portion 33 of the wire bond need not extend vertically relative to the bonded base 35, but rather can extend at a substantial angle therefrom (e.g., 15 to 90 degrees). Particular examples of the wire bonds formed this way can be as described in these incorporated applications.

Figure 9:
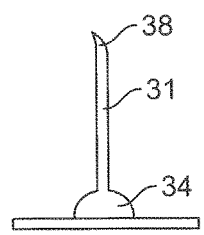
Figure 10:
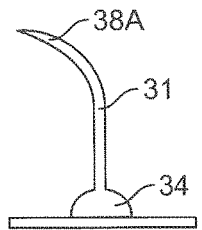

In the examples of FIGS. 9 and 10 showing a base ball-bonded to a surface, a tip 38 and 38A may be tapered as it extends from a cylindrical shaft 31 of a wire bond. In particular, as illustrated in FIG. 9, the tip 38 may be more narrow further away from the base 34. As illustrated in FIG. 10, the tip 38A may curve away from the vertical shaft 31 further away from the base 34. As further shown in FIG. 10, even further from the base 34, the tip 38A may then taper similarly to the tip 38.

Figure 11:
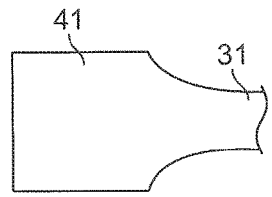
FIGS. 11 and 12 are plan views of arrangements of tips of wire bonds.
Figure 12:
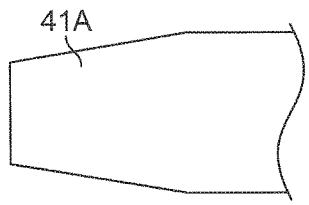

As shown in FIGS. 11 and 12, the tips 41, 41A of wire bonds may have particular shapes. In the example of FIG. 11, the tip 41 may extend from a cylindrical shaft 31 of the wire bond and may be tapered in one dimension. In such example, the tip 41 may be flattened in one dimension, which can facilitate bonding to another flat surface. In the example of FIG. 12, the tip 41A may be tapered to a narrower profile in more than one dimension. In such case, the tip 41A may be frusto-conical in shape or may have a flattened frusto-conical profile.

In some examples, when the base is formed by any of stitch bonding, wedge bonding, or ball bonding, a portion of the shaft of the wire bond adjacent to the base may extend away from the base in a direction not orthogonal to the surface, i.e. such that the portion of the shaft extends in a lateral direction away from the surface.

Often, the end of a metal wire is bonded to a surface by ball bonding or stitch or wedge bonding the wire at an end location of the wire, either before or after the wire is severed to define the end. However, techniques also exist for bonding a metal wire to a surface at a location of the wire other than an end location thereof. For example, a portion of a wire remote from the ends of the wire can be stitch bonded to a surface with the wire extending away from the bonded portion towards each end.

Figure 8:
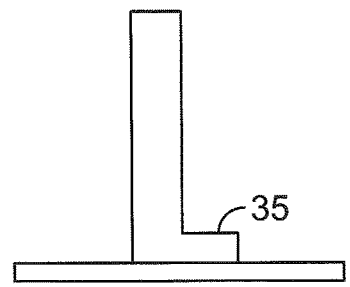

It can be observed that the metal wire has metal grains therein which can be elongated in a direction of the length of the wire, i.e., in a direction transverse to the diameter of the generally cylindrical shaft of the wire. In some examples, the wire can be made of gold, aluminum, copper, or copper alloy, among others. In some cases, as seen in FIG. 8, the wire can include a core of a primary metal and a finish layer of a metal different from the primary metal, such as, for example, palladium, as described, for example, in U.S. application Ser. No. 13/404,408 and 13/404,458 incorporated by reference herein.

Figure 13:
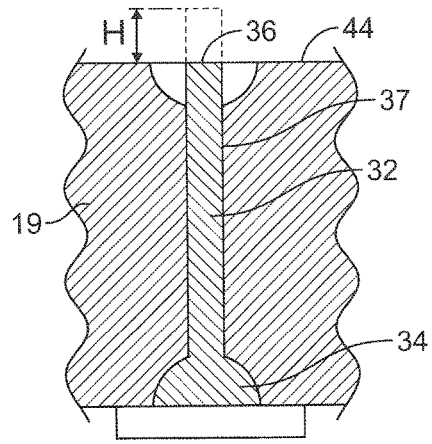
FIGS. 13 and 14 are sectional views of arrangements of wire bonds in accordance with embodiments of the present invention.
Figure 14:
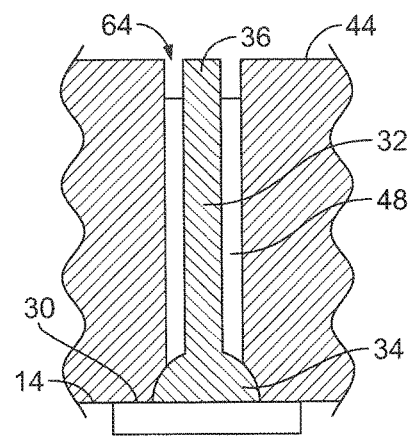

As further shown in FIG. 13, the encapsulation can be recessed downwardly from a major surface 44 thereof at a location adjacent an end 36 of the wire bond so as to provide a greater surface area at which a bond metal can contact the exposed end of the wire bond. Alternatively, or in addition thereto, the end 36 of the wire bond can extend to a height H above the surface 44 of the encapsulation. In such example, the encapsulation may be either recessed or may be flat where the wire bond extends above the height of the surface 44. FIG. 14 illustrates a further example, as described in the incorporated application Ser. No. 13/462, 158 wherein a material 48 surrounding an edge surface of the wire is recessed from the major surface 44 of the encapsulation 19, to provide a trench 64 in which a conductive bond material or bond metal may flow when the wire bonds of the interposer are joined, i.e., electrically connected with corresponding electrically conductive features of another component.

Figure 15:
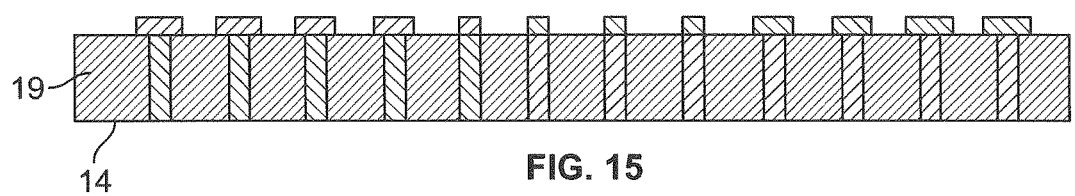
FIGS. 15-17 are sectional views illustrating the results of various types of processing that may be performed on interposers in accordance with embodiments of the present invention.

FIG. 15 further illustrates an interposer which can be formed by a subsequent step of thinning the interposer, such as by grinding, lapping or polishing, for example, applied to surface 14 of the encapsulation 19 subsequent to forming the encapsulation 19. In such case, the bases of the wire bonds may be removed during the thinning process. Such technique can be performed, for example, for the purpose of removing the bases of the wire bonds, such as when the spacing between the adjacent bases of the wire bonds may be closer than that which is desired or suitable for subsequent joining processes to the ends of the wire bonds at the side of the interposer adjacent surface 14.

Figure 16:
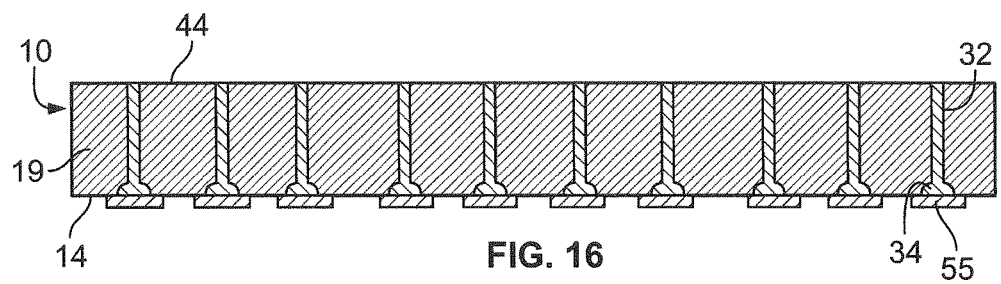

FIG. 16 illustrates another example in which the bases (either bases formed by ball or formed by stitch or wedge bonding, for example) can be attached to conductive elements 55 at the surface 14 of the encapsulation, wherein the conductive elements 55 can be portions remaining from a metal layer to which the wire bonds are bonded. In such case, after forming the wire bonds 32, the metal layer can be subsequently patterned, e.g., after forming the encapsulation 19. Such processing to subsequently pattern the metal layer to form conductive elements 55 can be as described for example in the incorporated application Ser. No. 13/462, 158. The conductive elements 55 may be the contacts 16 or contacts 46 of the interposer or may be internal structure to which the contacts 16 or contacts 46 are coupled, such as further described relative to FIGS. 18-20.

Figure 17:
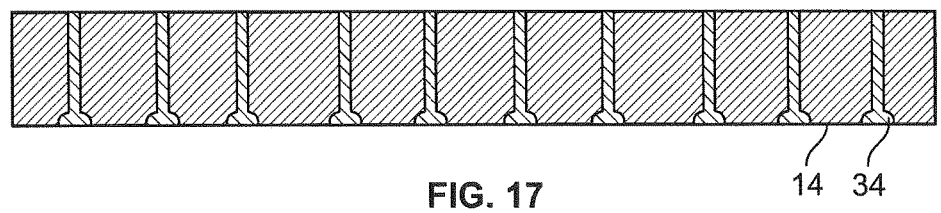

FIG. 17 illustrates a particular example in which at least a portion of the bases 34 of the wire bonds are exposed at a major surface 14 of the encapsulation as contacts of the interposer, e.g., the first or the second contacts thereof.

Figure 18:
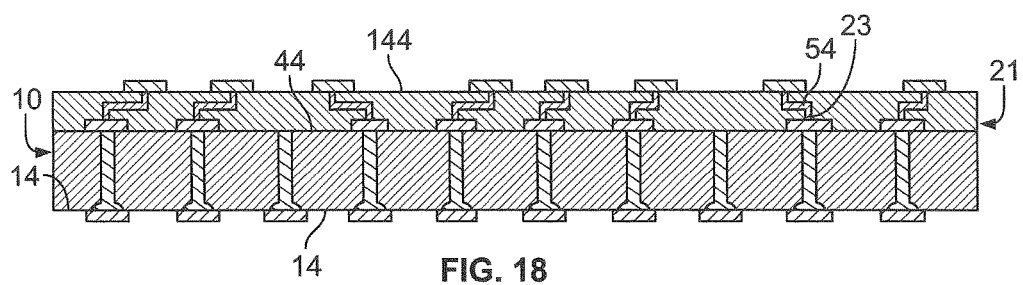
FIGS. 18-20 are sectional views of interposers having dielectric layers that may be exposed above a surface of an encapsulation of an interposer in accordance with embodiments of the present invention.
Figure 19:
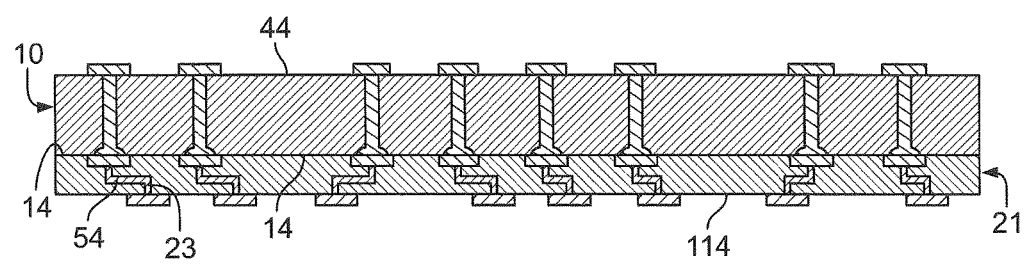
Figure 20:
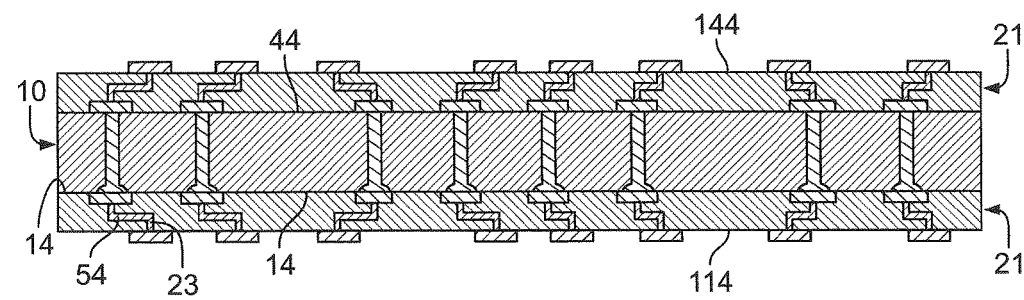

FIGS. 18-20 illustrate further examples in which a redistribution structure 21 having one or more dielectric layers can be additionally formed overlying one or more of the major surfaces 44, 14 of the encapsulation at the first or second sides 144, 114 of the interposer, wherein a surface of such dielectric layer is exposed above such surface of the encapsulation. The one or more dielectric layers can bear electrically conductive structure, which may include one or more electrically conductive redistribution layers. Redistribution structure 21 including traces 54 extending in a direction parallel to the surfaces 44, 14 of the encapsulation may be internally electrically connected by vias 23 extending through one or more of the dielectric layers. Thus, contacts 46 of the interposer may be electrically connected to the wire bonds 32 through the redistribution structure 21, and may be connected therethrough by at least traces which extend parallel to the encapsulation surfaces 44 and/or 14. FIG. 18 illustrates an example where the redistribution structure including dielectric layer(s) and conductive structure is disposed at side 144 above the surface 44 of encapsulation. FIG. 19 illustrates an example where the redistribution structure including dielectric layer(s) and conductive structure is disposed at side 114 above the surface 14. FIG. 20 illustrates an example where redistribution structures 21 are disposed above each of the respective surfaces 44, 14.

Figure 21:
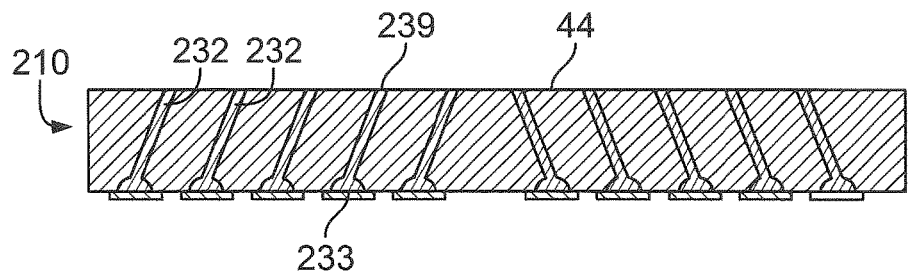
FIGS. 21 and 22 are sectional and plan views of an interposer in accordance with an embodiment of the present invention.
Figure 22:
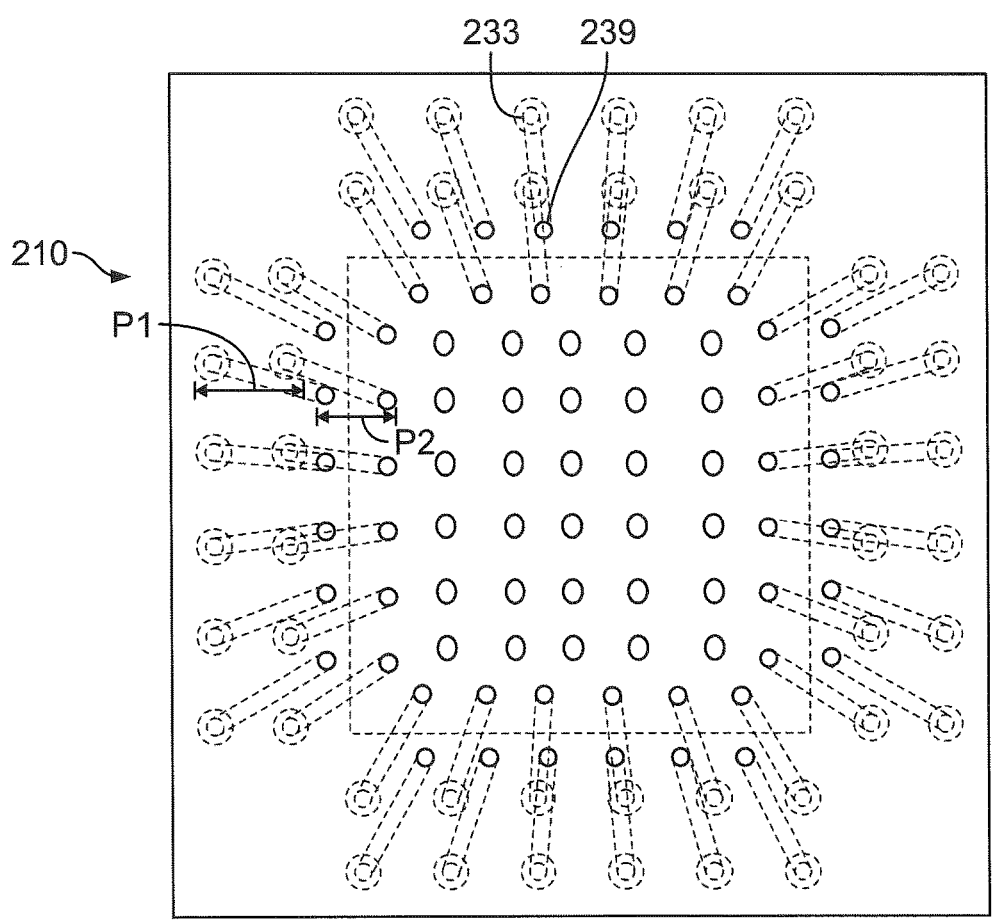

FIGS. 21 and 22 are a sectional view and a corresponding plan view further illustrating a particular example of an interposer 210 in which the second extremities 239 of at least some of the wire bonds are offset in a lateral direction parallel to a surface 44 of the encapsulation from their respective first extremities 233 from which they extend and are directly connected through the shaft of the respective wire bond. As further seen in FIGS. 21 and 22, the second extremities of the wire bonds can be spaced from one another at a different minimum pitch, e.g., pitch P2, between adjacent ones thereof than the original minimum pitch P1 between first extremities of adjacent wire bonds 232. Further description for making wire bonds having different placement at top and bottom surfaces of the encapsulation and having different minimum pitches at the encapsulation surfaces is provided by the incorporated application Ser. No. 13/462,158, such as the description relative to FIGS. 18 and 19 therein.

Figure 23:
FIGS. 23 and 24 are sectional and plan views of an interposer in accordance with an embodiment of the present invention.

The above-described embodiments of interposers or microelectronic assemblies incorporating the same can be further incorporated into a system such as that shown and described relative to FIG. 23 of incorporated application Ser. No. 13/462,158.

Figure 24:
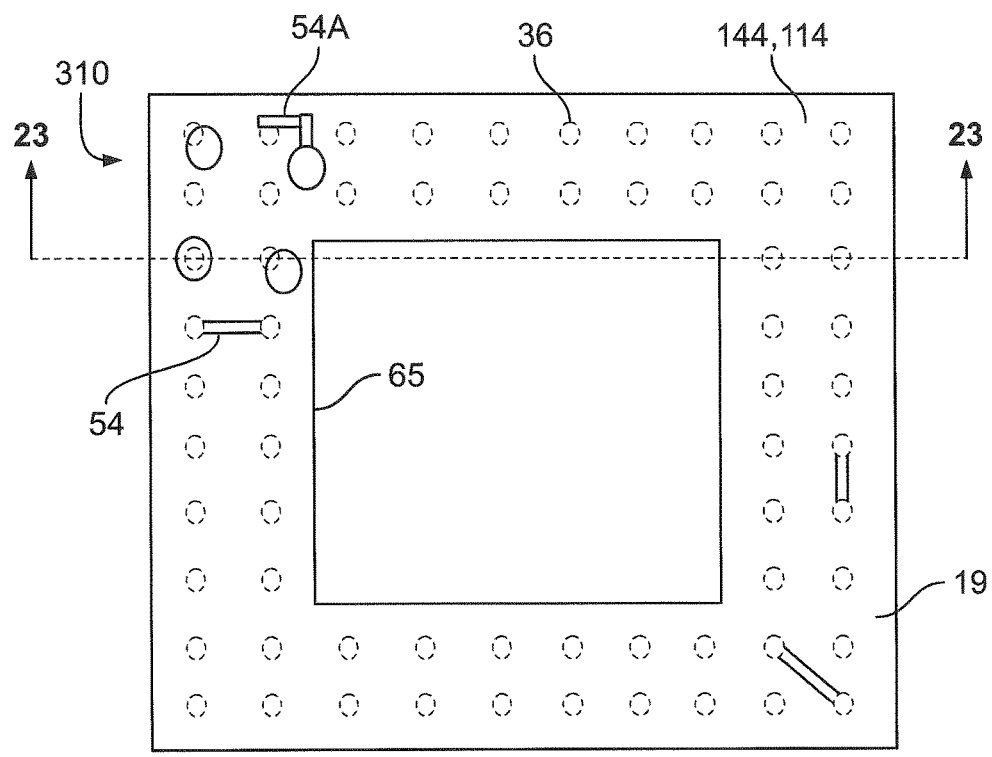

FIGS. 23 and 24 provide sectional and top views of a variation of the interposer according to any of the above-described examples in which an interposer 310 has a through opening 65 that extends from the first side 144 to the second side 114 of the interposer. As shown in FIG. 24, ends 36 (or bases 34) of the wire bonds 32 may be exposed at the first and second sides 144, 114 or may be electrically connected with other conductive structure provided on the interposer, such as traces 54, 54A thereon, which may extend in a direction parallel to one or both of the respective first and second sides 144, 114 of the interposer 310. As in the above-described examples (FIGS. 18-20), the traces 54 may overlie one or both of the oppositely-facing surfaces 14, 44 of the encapsulation, and may be part of a redistribution structure, or may be embedded relative to one or both surfaces 14, 44.

Figure 25:
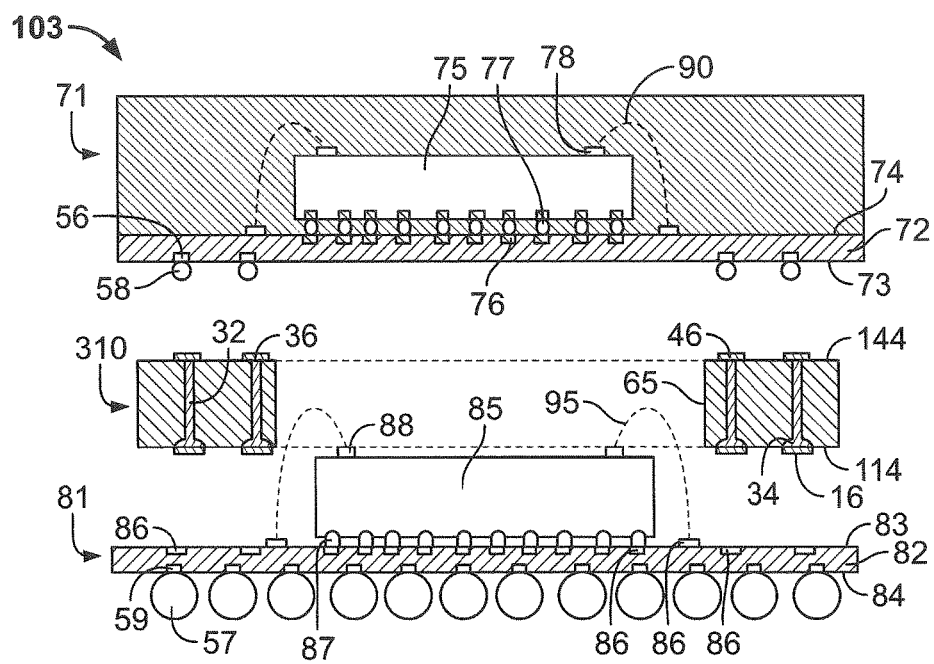
FIGS. 25 and 26 are sectional views of a microelectronic assembly that includes an arrangement of the interposer of FIGS. 23 and 24 in accordance with an embodiment of the present invention.

FIG. 25 is an exploded view illustrating a microelectronic assembly 103 in which first and second microelectronic packages 71, 81 can be assembled and electrically interconnected with one another through the interposer 310. A substrate 72 of the microelectronic package 71 may have a first surface 73 that faces a first side 144 of the interposer 310. Contacts 16 at side 114 of the interposer can be aligned with and joined to corresponding contacts 86 at a surface 83 of a dielectric element, e.g., substrate 82 of a microelectronic package 81, such as through a bond material or bond metal, e.g., gold, tin, indium, solder or entectic material at surfaces of the contacts 86 or contacts 16. Contacts 46 of the interposer 310 may be aligned with and joined to corresponding terminals 56 of microelectronic package 71, such as may be provided, for example at a first surface 73 of a substrate 72, through a bond material such as may be provided as joining elements 58, attached to terminals 56.

Figure 26:
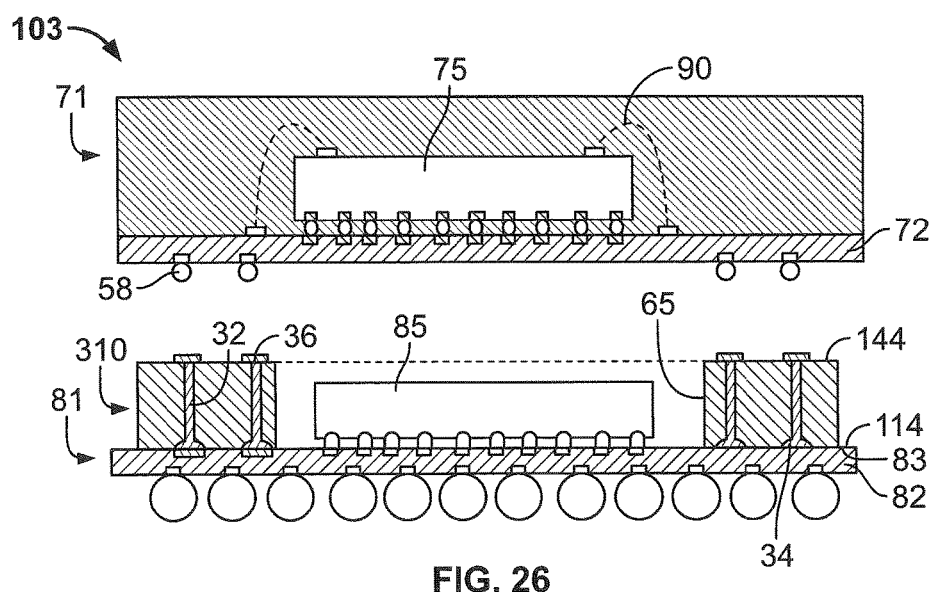

As further shown in FIG. 25 as well as FIG. 26, a first microelectronic element 75, as shown a "flip chip," may be placed on a second oppositely-facing surface 74 of the substrate 72 opposite the first surface 73 thereof. In the flip-chip arrangement as shown, the first microelectronic element 75 has a plurality of contacts 77 at a first element surface of the microelectronic element 75 for connection with respective contacts 76 at the second surface 74. In an alternative "face up" arrangement as further shown in FIGS. 25 and 26, the first microelectronic element 75 may have one or more bond pads 78 at an oppositely-facing second element surface of the microelectronic element 75 opposite the first element surface for electrically interconnecting with the respective contacts 76 at the second surface 74 through one or more respective bond wires 90 (shown as dashed lines in FIGS. 25 and 26). In such arrangements, at least some of the contacts 76 may be electrically connected with at least some of the contacts 56 at the first surface 73 of the substrate 72.

In this manner, the first microelectronic element 75 may be electrically interconnected with the at least some of the contacts 56.

Still referring to FIGS. 25 and 26, the second microelectronic package 81 may include a substrate 82 and a second microelectronic element 85 in a "flip chip" configuration in which the second microelectronic element is placed on and is electrically interconnected with a first surface 83 of the substrate 82. As shown, the second microelectronic element 85 may have one or more bumps 87 at a first element surface of the microelectronic element 85 for connection with respective contacts 86 at the first surface 83. In an alternative arrangement, the second microelectronic element 85 may have one or more bond pads 88 at an oppositely-facing second element surface of the microelectronic element 85 opposite the first element surface for electrically interconnecting with the respective contacts 86 at the first surface 83 through one or more respective bond wires 95 (shown as dashed lines in FIG. 23). Through such arrangements, the second microelectronic element 85 may be electrically interconnected with the contacts 57 at a second oppositely-facing surface 84 of the substrate 82 opposite the first surface 83 thereof.

With the substrate 82 in a fixed position, the interposer 310 then may be placed onto and joined to the substrate 82 with the through opening 65 of the interposer 310 circumscribing the second microelectronic element 85. Alternatively, with the interposer 310 in a fixed position, the substrate 82 may be placed against and joined to the interposer 310 with the second microelectronic element 85 placed within the through opening 65 of the interposer 310. In either arrangement, the first surface 83 of the substrate 82 may be placed flush against the second side 114 of the interposer 310. As shown by a contrast of FIGS. 23 and 24, the second microelectronic element 85 may be thinned to a thickness such that no portion of the second microelectronic element 85 is above first side 144 of the interposer 310 when the first surface 83 of the second microelectronic element 85 is placed flush against the second side 114 of the interposer 310. In an alternative arrangement (not shown) of the microelectronic assembly 103, the second microelectronic element 85 may not be thinned and instead may have a portion lying above the first side 44 of the interposer 310 and fitting between joining elements 58 and up to a point just below the first surface 73 of the substrate 72 of the first microelectronic package 71. In any of these arrangements, the first and second microelectronic packages 71, 81, including the first and second microelectronic elements 75, 85, may be electrically interconnected with one another through the interposer 310.

The first surface 83 of the substrate 82 of the second microelectronic package 81 may face the second side 14 of the interposer 310. The interposer 310 may be electrically interconnected with the second microelectronic package 81 through a connection between contacts 86 at the first surface 83 and bases 34 of respective wire bonds 32 of the interposer 310 that may overlie and interconnect with the respective contacts 86. Alternatively, the interposer 310 may include contacts (not shown) offset from the respective bases 34 of the wire bonds 32 that may be positioned to face and be joined with the respective contacts 86 at the first surface 83 of the substrate 82, such as through a bond metal such as described above for connections in a "flip-chip" mounting arrangement.

The second microelectronic package 81 may include terminals 59 at the second surface 84 of the substrate 82 electrically interconnected through conductive connections (not shown) through the substrate 82. Joining elements 57, which may be solder balls, among other possible structure, may be joined to the terminals 59 of the second microelectronic package 81 such that the second microelectronic package 81, and thus the microelectronic assembly 103 may be electrically interconnected to other devices or subassemblies.

Figure 27:
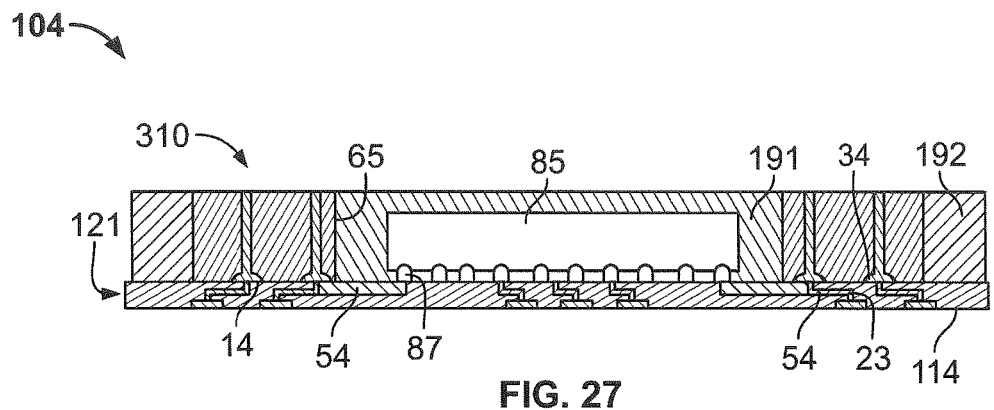
FIGS. 27 and 28 are sectional and plan views of a portion of a microelectronic assembly that includes an arrangement of the interposer of FIGS. 23 and 24 in accordance with an embodiment of the present invention.
Figure 28:
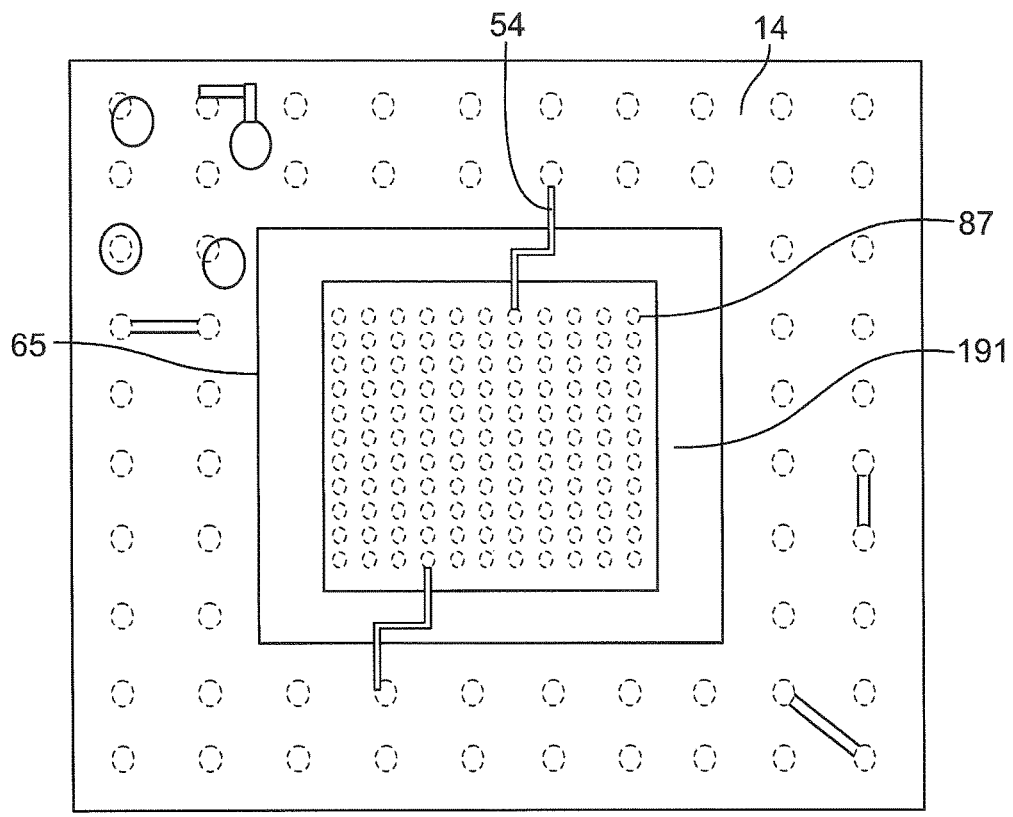

FIGS. 27 and 28 illustrate an alternative arrangement of the microelectronic assembly according to any of the above-described examples. In particular, FIG. 27 is a sectional view and FIG. 28 is a plan view of a second microelectronic package 121 received within the through opening 65 of the interposer 310 of a microelectronic assembly 104. In the example illustrated, the microelectronic assembly 104 may include all of the features of the microelectronic assembly 103 with the exception that the substrate 81 does not form a part of the assembly 104.

As shown, a redistribution structure 121 may be formed overlying the major surface 14 of the encapsulation at the second side 114 of the interposer 310. The redistribution structure 121 may have a structure according to the examples of FIGS. 18-20. As shown, the redistribution structure 121 may additionally have traces 54 that may be embedded within the dielectric layer of the redistribution structure 121 to electrically connect the second microelectronic element 85 with the interposer 310. As shown, the traces 54 may extend in a direction parallel to the second side 114 of the interposer 310 and electrically connect bumps 87 at a first element surface of the microelectronic element 85, when in the "flip chip" configuration, to the bases 34 of wire bonds 32. In some arrangements, contacts or other conductive structures may overlie and be connected to the base 34 of the wire bonds 32 or the bumps 87 of the second microelectronic element 85 which may be connected through traces 54 that overlie the dielectric layer of the redistribution structure 121.

As further shown an encapsulation 191 may be added to the through opening 65, which may fill the through opening to fix the position of the second microelectronic element 85 relative to the interposer 310 as described further herein. Encapsulation 192 may be added to circumscribe the interposer 310 to provide additional support and rigidity for the interposer 310. As further illustrated in FIG. 27, in some arrangements, the second microelectronic element 85 may be electrically connected to components or joining elements electrically connected at the second side 114 of the interposer 310 by vias 23 of the redistribution structure 121 which extend from and are electrically connected to the bumps 87 of the second microelectronic element 85.

Referring to FIG. 27 in particular, prior to forming the assembly of the interposer 310 and the redistribution structure 121, in some arrangements, the interposer 310 and the second microelectronic element 85 may be placed on a temporary carrier (not shown) simultaneously or in either order. The carrier may be a liquid carrier, which may be made of glass or metal materials. Such liquid carriers may be formed over a flat surface using a roll-on process, physical vapor deposition, or other known methods of applying this material. After placing the interposer 310 and the second microelectronic element 85 onto the carrier, the encapsulation 191 may be added to fill the region between the second microelectronic element 85 and the through opening 65 of the interposer 310. Moreover, in some arrangements, the encapsulation 192 may be added to circumscribe the interposer 310.

After the encapsulation has been cured or otherwise set, the assembly of the interposer 310, the second microelectronic element 85, the encapsulation 191, and the encapsulation 192 may be released from the carrier with the second microelectronic element 85 and the interposer 310 in fixed relative positions to each other. In some arrangements, the traces 54 may then be applied to overlie the encapsulation 191 and the major surface 14 of the encapsulation of the interposer 310 from the bumps 87 to the bases 34 of the wire bonds 32 to electrically connect the second microelectronic element 85 to the interposer 310. This entire assembly may then be placed onto the dielectric layer of the redistribution structure 121. Where either or both of the bumps 87 of the second microelectronic element 85 and the bases 34 of the wire bonds 32 are not in alignment, traces 54 may extend between and electrically connect these conductive elements to respective vias of the redistribution structure 121.

It is to be understood that features shown and discussed with respect to one aspect, embodiment, arrangement or configuration of the invention may be used in conjunction with any other aspect, embodiment, arrangement or configuration of the invention. For example, although certain figures and their corresponding descriptions illustrate vertical wire bonds, it is to be understood that the non-vertical wire bonds shown in other figures may also be used in accordance with any embodiment shown or described.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements and combinations of the embodiments provided herein are contemplated by the present application. Further enhancements may be devised without departing from the spirit and scope of the present invention as defined in the embodiments described herein.

The invention claimed is:

1. A microelectronic package comprising:
a dielectric encapsulation having first and second oppositely-facing surfaces;
a plurality of wire bonds extending between the first and second surfaces, each wire bond having first and second opposite ends at the respective first and second surfaces, and an edge surface between the first and second ends contacted by the encapsulation and separated from the edge surfaces of adjacent wire bonds by the encapsulation, at least one of the first and second ends of each wire bond being a base of such wire bond, each base being a portion of the respective wire bond other than a cylindrically-shaped shaft;
a first redistribution structure having a plurality of layers and defining a first major surface extending in a first plane, the first major surface of the first redistribution structure directly contacting and laminated onto the first surface of the encapsulation, the first redistribution structure including a plurality of first electrically conductive traces extending in one or more lateral directions substantially parallel to the first surface and the first major surface of the first redistribution structure, the first traces electrically connected to the first ends of at least some of the wire bonds;
a second redistribution structure having a plurality of layers and defining a second major surface extending in a second plane, the second major surface of the second redistribution structure directly contacting and laminated onto the second surface of the encapsulation, the second redistribution structure including a plurality of second electrically conductive traces extending in the one or more lateral directions, the second traces electrically connected to the second ends of at least some of the wire bonds;
a microelectronic element having a front surface having element contacts thereat electrically connected with at least some of the electrically conductive traces, a rear surface opposite the front surface, and edge surfaces extending between the front and rear surfaces, the microelectronic element disposed at least partially within the dielectric encapsulation, with the edge surfaces at least partially covered by the dielectric encapsulation.

2. A system comprising a microelectronic package according to claim 1 and one or more other electronic components electrically connected to the microelectronic package.

3. The system of claim 2, further comprising a housing, the microelectronic package and the other electronic components being mounted to the housing.

4. The microelectronic package of claim 1, wherein the dielectric encapsulation is a single continuous region of dielectric material.

5. The microelectronic package of claim 1, wherein the dielectric encapsulation includes first and second dielectric encapsulation regions, the first dielectric encapsulation region having a through opening extending between the first and second surfaces and sized to receive the entire front surface of the microelectronic element, the second dielectric encapsulation region disposed within the through opening and at least partially covering the edge surfaces of the microelectronic element.

6. The microelectronic package of claim 1, further comprising terminals at a surface of the first redistribution structure and electrically coupled to the traces, the terminals configured to electrically connect the microelectronic package with one or more external components, wherein the first redistribution structure comprises a fan-out layer, and an arrangement of the terminals has a different configuration than an arrangement of the first or second ends of the wire bonds.

7. The microelectronic package of claim 1, wherein the microelectronic element is a first microelectronic element, the microelectronic package further comprising a second microelectronic element having a front surface having element contacts thereat electrically connected with at least some of the electrically conductive traces.

8. The microelectronic package of claim 7, wherein the first and second microelectronic elements are arranged in a stacked configuration.

9. The microelectronic package of claim 1, wherein at least some of the wire bonds are not electrically connected to the element contacts of the microelectronic element within the microelectronic package.

10. The microelectronic package of claim 1, wherein at least some of the wire bonds are electrically connected to the element contacts of the microelectronic element by at least one of the first traces and the second traces.

11. The microelectronic package of claim 1, further comprising terminals at a surface of the redistribution structure configured to electrically connect the microelectronic package with one or more external components, wherein the element contacts of the microelectronic element face and are joined to at least some of the traces, and the element contacts are electrically coupled to the terminals through the traces.

* * * * *